(12) United States Patent
Hong et al.

(10) Patent No.: US 9,673,817 B2
(45) Date of Patent: Jun. 6, 2017

(54) MOBILE TERMINAL AND CONTROL METHOD THEREOF

(71) Applicant: LG ELECTRONICS INC., Seoul (KR)

(72) Inventors: Hyongpyo Hong, Seoul (KR); Misuk Park, Seoul (KR); Youngkyung Cha, Seoul (KR); Gooryong Kang, Seoul (KR); Kunsik Lee, Seoul (KR); Hyungjin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/324,671

(22) Filed: Jul. 7, 2014

(65) Prior Publication Data

US 2015/0008975 A1 Jan. 8, 2015

(30) Foreign Application Priority Data

Jul. 8, 2013 (KR) .................. 10-2013-0079881
Aug. 6, 2013 (KR) .................. 10-2013-0093349

(51) Int. Cl.
| | |
|---|---|
| H03K 17/955 | (2006.01) |
| H03K 17/94 | (2006.01) |
| H03K 17/95 | (2006.01) |
| G06F 3/042 | (2006.01) |
| G06F 3/0482 | (2013.01) |
| G06F 3/0488 | (2013.01) |
| A63F 13/837 | (2014.01) |
| A63F 13/92 | (2014.01) |
| A63F 13/214 | (2014.01) |

(52) U.S. Cl.
CPC ......... *H03K 17/955* (2013.01); *A63F 13/214* (2014.09); *A63F 13/837* (2014.09); *A63F 13/92* (2014.09); *G06F 3/0421* (2013.01); *G06F 3/0482* (2013.01); *G06F 3/04886* (2013.01); *H03K 17/941* (2013.01); *H03K 17/95* (2013.01)

(58) Field of Classification Search
CPC .. G06F 3/03545; G06F 3/0488; G06F 1/1626; G06F 3/038; G06F 1/16; G06F 1/1656; G06F 1/1684; G06F 2203/04108; G06F 3/017; G06F 3/03547; G06F 3/0416; G06F 3/04817; G06F 3/0482; G06F 3/04842; G06F 2203/04104; G06F 3/041
See application file for complete search history.

(56) References Cited

U.S. PATENT DOCUMENTS

| | | | | |
|---|---|---|---|---|
| 5,940,065 | A * | 8/1999 | Babb et al. ................... | 345/178 |
| 2005/0259851 | A1* | 11/2005 | Fyke ............................. | 382/124 |
| 2009/0251423 | A1 | 10/2009 | Jung ............................. | 345/173 |
| 2009/0251434 | A1* | 10/2009 | Rimon et al. ................ | 345/173 |
| 2009/0295715 | A1 | 12/2009 | Seo et al. ..................... | 345/156 |
| 2010/0131749 | A1 | 5/2010 | Kim et al. .................... | 713/100 |

(Continued)

OTHER PUBLICATIONS

International Search Report dated Oct. 15, 2014 issued in Application No. PCT/KR2014/005324.

*Primary Examiner* — Sujatha Sharma
(74) *Attorney, Agent, or Firm* — KED & Associates, LLP

(57) ABSTRACT

A method for operating a terminal according to an embodiment includes detecting an object that contacts the terminal, determining an operation of the terminal corresponding to the detected object, and performing the determined operation of the terminal.

11 Claims, 22 Drawing Sheets

(56) References Cited

U.S. PATENT DOCUMENTS

| | | | |
|---|---|---|---|
| 2011/0300881 A1 | 12/2011 | Sim et al. | 455/456.3 |
| 2011/0319128 A1 | 12/2011 | Miwa | 455/550.1 |
| 2012/0306927 A1* | 12/2012 | Lee | G06F 3/041 |
| | | | 345/660 |
| 2013/0002574 A1* | 1/2013 | Kim | G06F 3/041 |
| | | | 345/173 |
| 2014/0168171 A1* | 6/2014 | Oh et al. | 345/178 |
| 2014/0253464 A1* | 9/2014 | Hicks et al. | 345/173 |
| 2014/0267150 A1* | 9/2014 | Masashi | 345/174 |
| 2014/0320425 A1* | 10/2014 | Jeong | G06F 3/1454 |
| | | | 345/173 |
| 2015/0054794 A1* | 2/2015 | Li et al. | 345/177 |
| 2015/0060120 A1* | 3/2015 | Park | 174/257 |
| 2015/0065200 A1* | 3/2015 | Namgung et al. | 455/566 |
| 2015/0185760 A1* | 7/2015 | Schroeder | G06F 1/16 |
| 2016/0011738 A1* | 1/2016 | Bang | G06F 1/1637 |
| | | | 345/173 |

\* cited by examiner (a)            (b)

(a)

(b)

(a)

(b)

(a)

(b)

(c)

(a)

(b)

MOBILE TERMINAL AND CONTROL METHOD THEREOF

CROSS-REFERENCE TO RELATED APPLICATIONS

This application claims the benefit of Korean Patent Application No. 10-2013-0079881, filed on Jul. 8, 2013 entitled "MOBILE TERMINAL AND CONTROL METHOD THEREOF" and Korean Patent Application No. 10-2013-0093349, filed on Aug. 6, 2013 entitled "TERMINAL AND OPERATING METHOD THEREOF", which is hereby incorporated by reference in its entirety into this application.

BACKGROUND

The present disclosure relates to a terminal and a method for operating the same, and particularly, to a terminal for detecting an object that contacts the terminal and a method for operating the same.

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

Efforts are ongoing to support and increase the functionality of mobile terminals. Such efforts include software and hardware improvements, as well as changes and improvements in the structural components.

SUMMARY

In one embodiment, a method for operating a terminal includes detecting an object that contacts the terminal, determining an operation of the terminal corresponding to the detected object, and performing the determined operation of the terminal.

In another embodiment, a terminal includes a proximity sensor unit configured to detect an object that contacts the terminal, and a control unit configured to determine an operation of the terminal corresponding to the detected object and perform the determined operation of the terminal.

The details of one or more embodiments are set forth in the accompanying drawings and the description below. Other features will be apparent from the description and drawings, and from the claims.

DETAILED DESCRIPTION OF THE EMBODIMENTS

Hereinafter, a terminal according to an embodiment will be described in detail with reference to the accompanying drawings. In the following description, the terms "module"

and "unit" for referring to elements are assigned and used interchangeably for ease of description, and thus, the terms per se do not necessarily have different meanings or functions.

A terminal described herein may include a mobile terminal such as a mobile phone, a smartphone, a smart pad, a laptop computer, a terminal for digital broadcasting, a personal digital assistant (PDA), a portable multimedia player (PMP) and a navigator. However, those skilled in the art would understand that configurations according to the embodiments described herein may also be applied to not only mobile devices but also non-mobile devices such as digital TVs and desktop computers.

A structure of a terminal according to an embodiment will be described with reference to FIG. 1.

Figure 1:
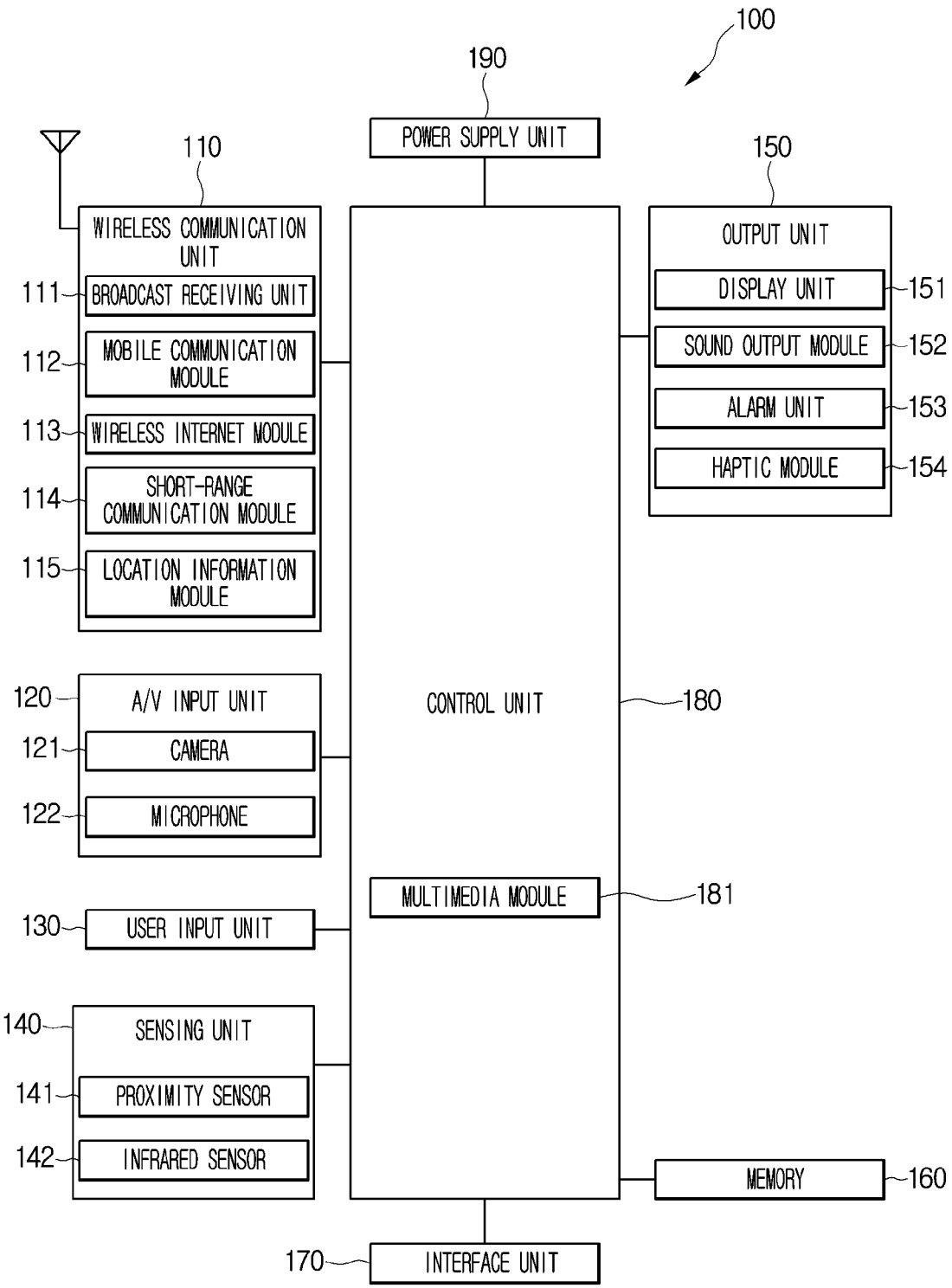
FIG. 1 is a block diagram illustrating a terminal according to an embodiment.

FIG. 1 is a block diagram illustrating a terminal according to an embodiment.

A terminal 100 may include a wireless communication unit 110, an audio/video (A/V) input unit 120, a user input unit 130, a sensing unit 140, an output unit 150, a memory 160, an interface unit 170, a control unit 180, and a power supply unit 190. The elements illustrated in FIG. 1 may not be essential, and thus, some elements may be omitted or other elements may be added.

Hereinafter, the above-mentioned elements will be described.

The wireless communication unit 100 may include at least one module that enables communication between the terminal 100 and a wireless communication system or between the terminal 100 and a network where the terminal 100 is located. For example, the wireless communication unit 110 may include a broadcast receiving unit 111, a mobile communication module 112, a wireless internet module 113, a short-range communication module 114, and a location information module 115.

The broadcast receiving unit 111 receives, from an external broadcast management server, a broadcast signal and/or broadcast-related information through a broadcast channel.

The broadcast channel may include a satellite channel and a terrestrial channel. The broadcast management server may represent a server that generates and transmits the broadcast signal and/or the broadcast-related information, or a server that receives a pre-generated broadcast signal and/or broadcast-related information and transmits the received broadcast signal and/or broadcast-related information to the terminal. The broadcast signal may include not only a TV broadcast signal, a radio broadcast signal, and a data broadcast signal but also a broadcast signal obtained by combining the TV or radio broadcast signal with the data broadcast signal.

The broadcast-related information may represent information related to a broadcast channel, a broadcast program, or a broadcast service provider. The broadcast-related information may also be provided through a mobile communication network. In this case, the broadcast-related information may be received by the mobile communication module 112.

The broadcast-related information may have various formats. For example, the broadcast-related information may have a format of an electronic program guide (EPG) of digital multimedia broadcasting (DMB) or an electronic service guide (ESG) of a digital video broadcast-handheld (DVB-H).

The broadcast receiving module 111 may receive a digital broadcast signal using a digital broadcasting system such as digital multimedia broadcasting-terrestrial (DMB-T), digital multimedia broadcasting-satellite (DMB-S), media forward link only (MediaFLO), digital video broadcast-handheld (DVD-H), or integrated services digital broadcast-terrestrial (ISDB-T). The broadcast receiving module 111 may also be configured to be suitable for other broadcasting systems.

The broadcast signal and/or the broadcast-related information received through the broadcast receiving module 111 may be stored in the memory 160.

The mobile communication module 112 transmits/receives radio signals to/from at least one of a base station, an external terminal, and a server on the mobile communication network. The radio signal may include various types of data according to transmission of a voice call signal, a video call signal, or text/multimedia messages.

The wireless internet module 113 represents a module for wireless internet access, and may be installed in the terminal 100 or outside the terminal 100. A wireless internet technology such as wireless LAN (WLAN) (Wi-Fi), wireless broadband (Wibro), world interoperability for microwave access (Wimax), or high speed downlink packet access (HSDPA) may be used.

The short-range communication module 114 represents a module for short-range communication. A short-range communication technology such as Bluetooth, radio frequency identification (RFID), infrared data association (IrDA), ultra wideband (UWB), or ZigBee may be used.

The location information module 115 serves to acquire a location of the terminal 100, and a representative example of the location information module 115 is a global positioning system (GPS) module.

Referring to FIG. 1, the A/V input unit 120 is for inputting an audio signal or a video signal, and may include a camera 121 and a microphone 122. The camera 121 processes image frames of still images or video obtained by an image sensor in a video call mode or a shooting mode. The processed image frames may be displayed on a display unit 151.

The image frames processed in the camera 121 may be stored in the memory 160 or may be transmitted to the outside through the wireless communication unit 110. Two or more cameras 121 may be provided according to a use environment.

The microphone 122 receives and processes an external sound signal to obtain electric voice data, in a call mode, a recording mode, or a voice recognition mode. In the case of the call mode, the obtained voice data may be converted into such a format as to be transmitted to a mobile communication base station through the mobile communication module 112. Various noise elimination algorithms may be applied to the microphone 122 to eliminate noise generated while the external sound signal is received.

The user input unit 130 receives input data for controlling the terminal 100. The user input unit 130 may include a keypad, a dome switch, a touchpad (resistive/capacitive type), a jog wheel, and a jog switch.

The sensing unit 140 detects a current state of the terminal 100, for example, detects whether the terminal 100 is opened/closed and whether a user contacts the terminal 100, and detects an azimuth and acceleration/deceleration of the terminal 100. Then, the sensing unit 140 generates a sensing signal for controlling an operation of the terminal 100. For example, in the case where the terminal 100 is a slide-type phone, it may be sensed whether the phone is opened/closed. Further, it may be sensed whether power is supplied by the power supply unit 190 and whether the interface unit 170 is connected to an external device. The sensing unit 140 may include a proximity sensor 141.

The output unit 150 serves to generate visual, auditory, and tactile outputs. The output unit 150 may include the display unit 151, a sound output module 152, an alarm unit 153, and a haptic module 154.

The display unit 151 displays (outputs) information processed in the terminal 100. For example, in the case where the terminal 100 is in the call mode, the display unit 151 displays a user interface (UI) or graphic user interface (GUI) related to a call. In the case where the terminal 100 is in the video call mode or the shooting mode, the display unit 151 displays the UI, GUI, or shot and/or received images.

The display unit 151 may include at least one of a liquid crystal display (LCD), a thin film transistor-liquid crystal display (TFT LCD), an organic light-emitting diode (OLED), a flexible display, and a 3D display.

Some of the displays may be transparent or light transmissive displays. Such a display may be referred to as a transparent display. The transparent display includes, for example, a transparent OLED (TOLED). A rear structure of the display unit 151 may also be light transmissive. Due to such structures, a user may view an object located at the back of a body of the terminal through an area of the display unit 151 of the terminal.

According to the type of the terminal 100, two or more display units 151 may be provided. For example, a plurality of display units may be arranged integrally or separately on one surface of the terminal 100 or may be arranged on different surfaces respectively.

In the case where the display unit 151 and a sensor for sensing a touch motion (hereinafter referred to as a touch sensor) form a layer structure (hereinafter referred to as a touch screen), the display unit 151 may be used as both an output device and an input device. The touch sensor may include, for example, a touch film, a touch sheet, and a touch pad.

The touch sensor may be configured so that a change in a pressure on a specific site of the display unit 151 or a change in a capacitance of a specific site of the display unit 151 is converted to an electric input signal. The touch sensor may be configured so as to detect not only a location and an area of a touch but also a pressure of the touch.

When a touch input is performed on the touch sensor, signal(s) corresponding to the touch input is (are) transmitted to a touch controller. The touch controller processes the signal(s) and then transmits the processed signal(s) to the control unit 180. In this manner, the control unit 180 may recognize what region of the display unit 151 has been touched.

Referring to FIG. 1, the proximity sensor 141 may be arranged in an internal region of the terminal 100 surrounded by the touch screen or in the vicinity of the touch screen. The proximity sensor 141 represents a sensor that detects an object approaching a certain detection surface or an object located near the sensor using force of an electromagnetic field or infrared rays without mechanically contacting the object. The proximity sensor 141 has a longer life than that of a contact-type sensor and may be widely applied.

The proximity sensor 141 may include, for example, a transmissive photoelectric sensor, a direct reflection-type photoelectric sensor, a mirror reflection-type photoelectric sensor, a high-frequency oscillation-type proximity sensor, a capacitive-type proximity sensor, a magnetic proximity sensor, and an infrared proximity sensor. In the case where the touch screen is a capacitive type, an approach of the pointer is detected due to a change in an electric field. In this case, the touch screen (touch sensor) may be classified as a proximity sensor.

Hereinafter, for convenience, "proximity touch" represents an act of locating the pointer over the touch screen without making a contact therewith, and "contact touch" represents an act of making the pointer actually contact the touch screen. The location over the touch screen proximity-touched by the pointer represents a location where the pointer vertically opposes the touch screen when the pointer performs the proximity touch.

The proximity sensor 141 detects the proximity touch and a proximity touch pattern (e.g. a proximity touch distance, a proximity touch direction, a proximity touch speed, a proximity touch time, a proximity touch location, a proximity touch movement state, etc). Information corresponding to the detected proximity touch motion and the proximity touch pattern may be output to the touch screen. The display unit 151 may include the touch screen.

Figure 2:
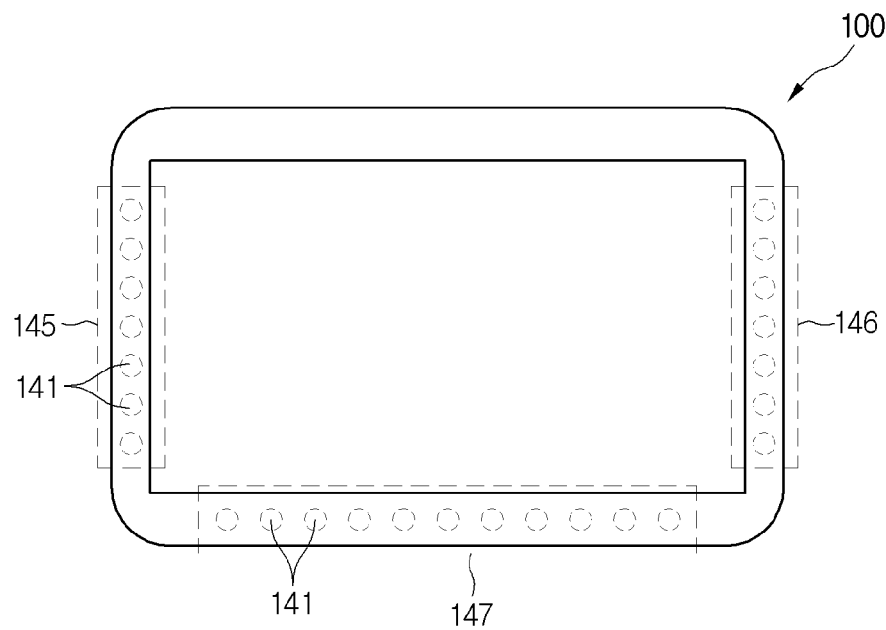
FIGS. 2 and 3 are diagrams exemplarily illustrating a plurality of proximity sensors provided to the terminal according to an embodiment.
Figure 3:
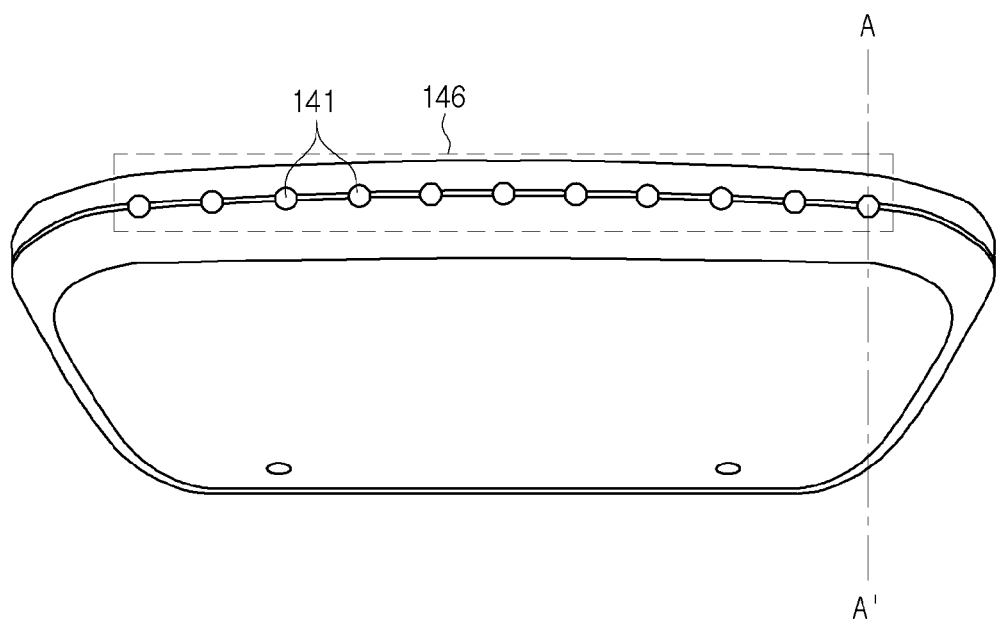

FIGS. 2 and 3 are diagrams exemplarily illustrating a plurality of proximity sensors provided to the terminal according to an embodiment.

As illustrated in FIGS. 2 and 3, the terminal 100 according to an embodiment includes a plurality of first sensors 145 provided to a left side of the terminal 100, a plurality of second sensors 146 provided to a right side of the terminal 100, and a plurality of third sensors 147 installed on a lower side of the terminal 100. The terminal 100 may further include a plurality of fourth sensors (not illustrated) installed on an upper side of the terminal 100.

The proximity sensor 141 may include an infrared sensor 142.

Referring to FIG. 1, the infrared 142 may be arranged in the vicinity of the touch screen. The infrared sensor 142 detects an object that contacts a certain detection surface by means of infrared light.

For example, a light-emitting unit including an infrared light-emitting element such as an infrared light-emitting diode and a light-receiving unit including the infrared sensor 142 may be arranged in the vicinity of the touch screen. The number of the infrared sensors 142 may be determined according to the resolution of the display unit 151.

The light-emitting unit may be arranged on one side of the touch screen, and the light-receiving unit may be arranged on the other side of the touch screen. Alternatively, the light-emitting unit may be arranged on a lower end portion of the touch screen, and the light-receiving unit may be arranged on an upper end portion of the touch screen. However, the arrangement of the light-emitting unit and light-receiving unit is not limited thereto.

If there is no touch action by a human finger or an additional touch tool on the touch screen or in the vicinity of the touch screen, the entirety of infrared light emitted from the light-emitting unit is detected by the infrared sensor 142. That is, if infrared light is not detected by the infrared sensor 142 of the light-receiving unit, it may be determined that a touch action has been performed at a point where the infrared light is not detected.

In this manner, the control unit 180 may determine final coordinates (x,y) of the touch point on the basis of a horizontal coordinate value x and a vertical coordinate value y of the touch point sensed by the sensing unit 140. Furthermore, the control unit 180 may also determine the size or shape of a plurality of touch points on the basis of horizontal coordinate values and vertical coordinate values of the plurality of touch points sensed by the sensing unit 140, but the control unit 180 is not limited thereto.

Figure 4:
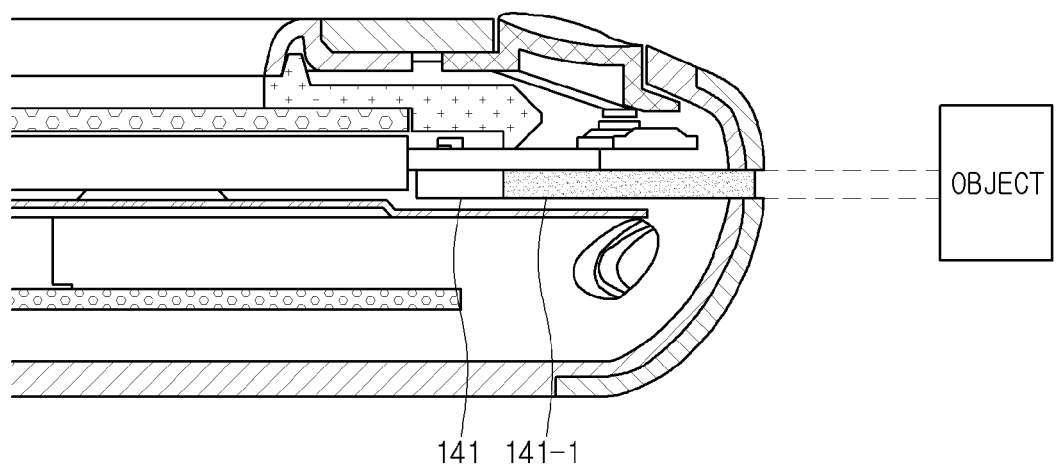
FIG. 4 is a cross-section view of the terminal taken along the line A-A' of FIG. 2.

FIG. 4 is a cross-section view of the terminal taken along the line A-A' of FIG. 3.

As illustrated in FIG. 4, each proximity sensor 141 arranged in the terminal according to an embodiment may include an optical guide 141-1 for guiding light emitted from the proximity sensor 141. Light may be emitted or light reflected from an object may be received through the optical guide 141-1 so as to correctly sense the proximity of the object.

The sound output module 152 may output audio data received from the wireless communication unit 110 or stored in the memory 160 in a call signal receiving mode, a call mode, a recording mode, a voice recognition mode, or a broadcast receiving mode. The sound output module 152 may output a sound signal related to a function performed in the terminal 100 (e.g. call signal receiving sound, message receiving sound, etc). The sound output unit 152 may include a receiver, a speaker, a buzzer, and the like.

The alarm unit 153 outputs a signal for notifying an event occurrence of the terminal 100. An event that occurs in the terminal 100 may include, for example, call signal reception, message reception, key signal input, and touch input. The alarm unit 153 may output the signal for notifying the event occurrence in a different form from a video or audio signal, such as vibration. The video signal or audio signal may also be output through the display unit 151 or the sound output module 152. Therefore, the display unit 151 or the sound output module 152 may be classified as a part of the alarm unit 153.

The haptic module 154 generates various tactile effects that may be felt by a user. The tactile effect generated by the haptic module 154 includes, for example, vibration. An intensity and a pattern of the vibration generated by the haptic module 154 may be controlled. For example, different vibrations may be synthesized to be output, or may be sequentially output.

In addition to the vibration effect, the haptic module 154 may generate various tactile effects caused by a pin arrangement vertically moving on a contact skin surface, jet or suction of air through a jet or suction hole, sweeping on a skin surface, contact of an electrode, and stimulation by electrostatic force, or effects of giving feeling of warmth/coldness using a heat-absorbing or heating device.

The haptic module 154 may be configured so as to give the tactile effects to a user not only through a direct contact but also through muscle sense of a finger or an arm. Two or more haptic modules 154 may be provided according to a configuration of the terminal 100.

The memory 160 may store a program for operating the control unit 180 and may temporarily store input/output data (e.g. phonebook, message, still image, video, etc). The memory 160 may store data on various patterns of vibration and sound output when a touch input performed on the touch screen.

The memory 160 may include at least one of storage media such as a flash memory, a hard disk, a multimedia card micro type, a card-type memory (e.g. SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk. The terminal 100 may be operated in association with a web storage for performing a storage function of the memory 160 on the internet.

The interface unit 170 serves as a passage to all external devices connected to the terminal 100. The interface unit 170 receives data from the external devices, delivers power to each element in the terminal 100, or allows data in the terminal 100 to be transmitted to the external devices. For example, the interface unit 170 may include a wired/wireless headset port, an external charger port, a wired/wireless data port, a memory card port, a port for connecting a device having an identification module, an audio input/output (I/O) port, a video I/O port, and an earphone port.

The identification module stores various pieces of information for authenticating the authority to use the terminal 100. The identification module may include a user identify module (UIM), a subscriber identity module (SIM), and a universal subscriber identity module (USIM). The device having the identification module (hereinafter referred to as an identification device) may be manufactured in a form of a smart card. Thus, the identification device may be connected to the terminal 100 through a port.

The interface unit 170 may serve as a passage for supplying power from an external cradle to the terminal 100 when the terminal 100 is connected to the cradle, or may serve as a passage for transmitting various command signals, which are input to the cradle by a user, to the terminal 100. The various command signals or the power input from the cradle may operate as a signal for recognizing whether the terminal 100 is correctly mounted on the cradle.

The control unit 180 controls an overall operation of the terminal 100. For example, the control unit 180 performs a control operation and a processing operation related to a voice call, data communication, and a video call. The control unit 180 may be provided with a multimedia module 181 for playing multimedia. The multimedia module 181 may be installed in the control unit 180 or may be separated from the control unit 180.

The control unit 180 may perform a pattern recognition process for recognizing characters or images from a handwriting input or a picture drawing input performed on the touch screen.

The power supply unit 190 receives external power and internal power and supplies power required for operating each element, according to control by the control unit 180.

The various embodiments described herein may be implemented, for example, in a recording medium readable by a computer or a similar device using software, hardware, or a combination thereof.

For implementation with hardware, the embodiments described herein may be implemented using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and other electric units. In some cases, such embodiments may be implemented by the control unit 180.

For implementation with software, an embodiment related to a procedure or a function may be implemented with a separate software module for performing at least one function or operation. A software code may be implemented by a software application coded by an appropriate programming language. The software code may be stored in the memory 160 and may be executed by the control unit 180.

The terminal 100 for providing a menu item shortcut service upon receiving a figure as an input will be described with reference to FIGS. 5 and 6.

Figure 5:
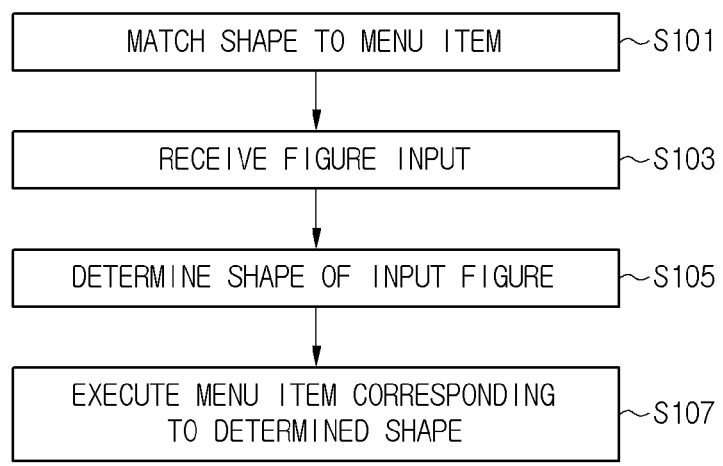
FIG. 5 is a flowchart illustrating a method for operating the terminal according to an embodiment.

FIG. 5 is a flowchart illustrating a method for operating the terminal according to an embodiment.

Referring to FIG. 5, the control unit 180 matches a shape to a menu item (operation S101).

The control unit 180 may match the shape to the menu item according to a provider input or a user input.

The shape may represent a two-dimensional figure or a three-dimensional figure, but is not limited thereto. For example, the shape may have a form of one side of a three-dimensional block.

The menu item may include a hardware function provided by the terminal 100 and a software function provided by an application installed in the terminal 100, but is not limited thereto.

The control unit 180 may match a plurality of shapes to a plurality of menu items.

The plurality of shapes matched to the plurality of menu items will be described with reference to FIG. 6.

Figure 6:
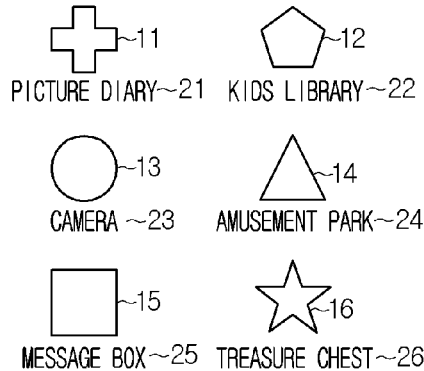
FIG. 6 is a diagram illustrating shapes of figures recognized by the terminal according to an embodiment.
Figure 6:
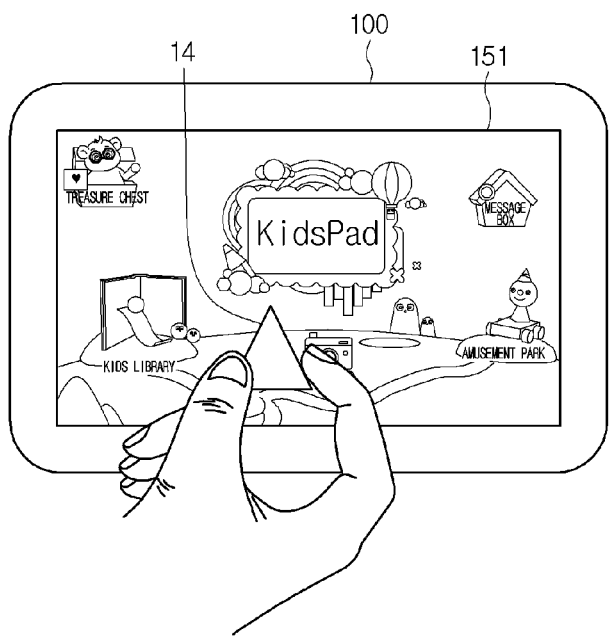

FIG. 6 is a diagram illustrating the shapes of figures recognized by the terminal according to an embodiment.

Referring to FIG. 6A, six different shapes may be matched to six different menu items.

For example, a cross shape 145, a pentagon shape 146, a circle shape 147, a triangle shape 14, a quadrangle shape 15, and a star shape 16 may be respectively matched to a picture diary 21, a kids library 22, a camera 23, an amusement park 24, a message box 25, and a treasure chest 26 which are menu items provided by a kids pad.

Here, the kids pad may be a hardware function provided by the terminal 100 or a software application installed therein, but is not limited thereto.

Description is provided below, referring back to FIG. 5.

The control unit 180 receives a figure input (operation S103). For example, the control unit 180 may detect the existence of an object that contacts the touch screen using the infrared sensor 142. Furthermore, the control unit 180 may detect the existence of an object adjacent to the touch screen using the proximity sensor 141. Reception of a figure input will be described in detail, referring back to FIG. 6.

Referring to FIG. 6B, when a user places a three-dimensional block of which a bottom side has the triangle shape on the display unit 151 including the touch screen of the terminal 100, the control unit 180 may receive a figure input through the infrared sensor 142. However, the figure input is not limited to the example described above with reference to FIG. 6B.

Description is provided below, referring back to FIG. 5.

When the figure input is received, the control unit 180 determines the shape of the input figure (operation S105). For example, the control unit 180 may determine the shape of a corresponding object using horizontal coordinate values and vertical coordinate values of a plurality of touch points sensed by the infrared sensor 142.

Referring back to FIG. 6B, the control unit 180 may determine that the object has the triangle shape 14 on the basis of the figure input received through the infrared sensor 142.

Description is provided below, referring back to FIG. 5.

The control unit 180 performs a menu item corresponding to the determined shape (operation S107). The menu item corresponding to the determined shape may represent the menu item matched to the shape determined in operation S101 described above. The execution of the menu item corresponding to the determined shape will be described in detail with reference to FIG. 6.

When the shape of the object placed on the touch screen is determined as the triangle shape 14, as illustrated in FIG. 6B, the control unit 180 may perform the menu item of the amusement park 24 corresponding to the triangle shape 14 as illustrated in FIG. 6A. That is, the control unit 180 may display an execution screen of the amusement park 24 on the display unit 151, although not illustrated in the drawings.

In this manner, the terminal 100 may detect a figure input corresponding to a command for executing a specific application using the sensor unit 140.

The terminal 100 for simultaneously executing and displaying a plurality of applications in response to reception of a plurality of figure inputs will be described with reference to FIGS. 7 and 8. Hereinafter, descriptions that overlap with the above descriptions will be omitted or briefly provided, and different portions will be described in detail.

Figure 7:
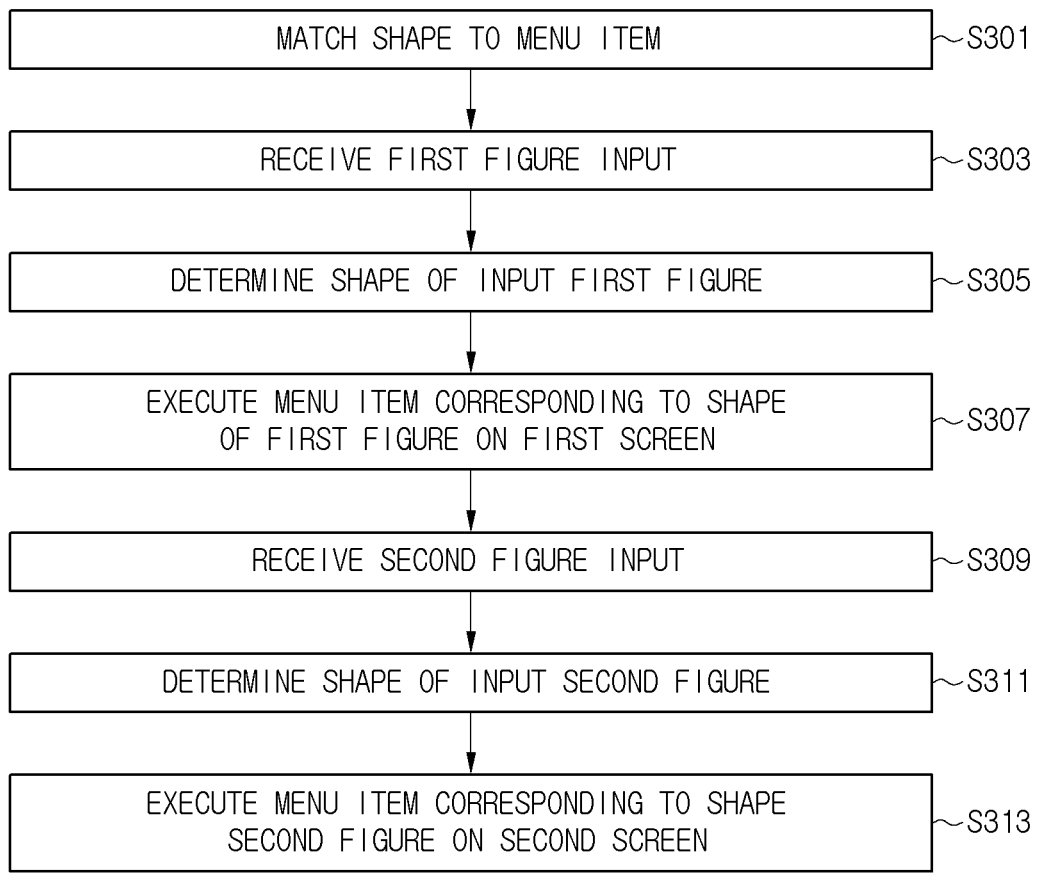
FIG. 7 is a flowchart illustrating a method for operating the terminal according to an embodiment.

FIG. 7 is a flowchart illustrating a method for operating the terminal according to an embodiment.

Referring to FIG. 7, the control unit 180 matches a shape to a menu item (operation S301). As described above with reference to FIG. 6A, the control unit 180 may match a plurality of different shapes to a plurality of different menu items.

Thereafter, when a first figure input is received (operation S303), the control unit 180 determines the shape of the first figure (operation S305), and executes a menu item corresponding to the shape of the first figure to display the executed menu item on a first screen (operation S307). The execution of the menu item corresponding to the shape of the first figure will be described in detail with reference to FIG. 8.

Figure 8:
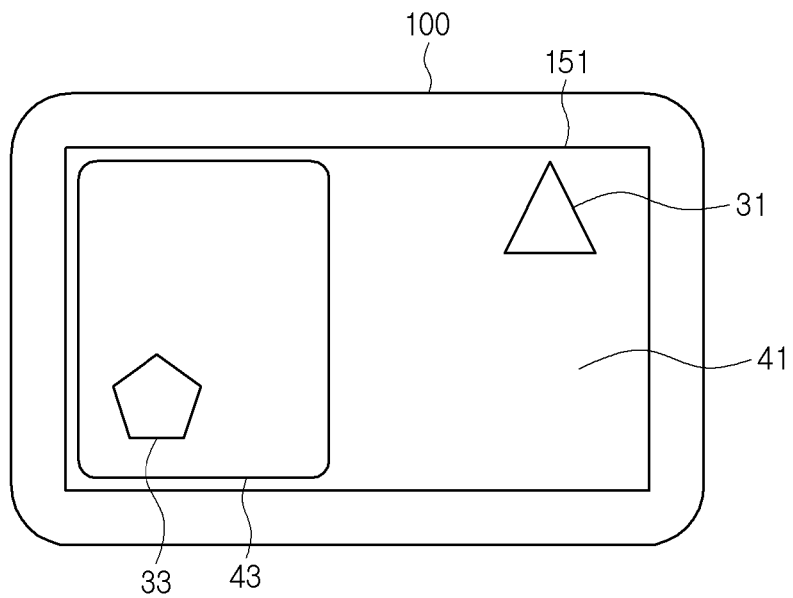
FIG. 8 is a diagram illustrating a screen of the terminal recognizing a plurality of shapes according to an embodiment.

FIG. 8 is a diagram illustrating a screen of the terminal recognizing a plurality of shapes according to an embodiment.

Referring to FIG. 8, the control unit 180 may determine the shape of a first FIG. 31 when the first FIG. 31 that contacts the touch screen is detected by the infrared sensor 142, and may display an execution screen 41 of a first application corresponding to the shape of the first FIG. 31, i.e., a triangle shape, on an entire screen of the display unit 151.

Description is provided below, referring back to FIG. 7.

Thereafter, when a second figure input is received (operation S309), the control unit 180 determines the shape of the second figure (operation S311), and executes a menu item corresponding to the shape of the second figure to display the executed menu item on a second screen (operation S313).

Referring back to FIG. 8, the control unit 180 may determine the shape of a second FIG. 33 when the second FIG. 33 that contacts the touch screen is detected by the infrared sensor 142, and may display an execution screen 43 of a second application corresponding to the shape of the second FIG. 33, i.e., a pentagon shape, on a partial screen of the display unit 151.

That is, the control unit 180 may overlaying the execution screen 43 of the second application which is smaller than a background screen on a part of the background screen, while displaying the execution screen 41 of the first application as the background screen of the display unit 151.

Alternatively, although not illustrated in the drawings, the control unit 180 may reconfigure the screen so that the execution screen 41 of the first application and the execution screen 43 of the second application are display in a grid pattern. Here, the size of the execution screen 41 of the first application may be the same as or different from that of the execution screen 43 of the second application, but the sizes of the screens are not limited thereto.

In this manner, the terminal 100 may detect a plurality of figure inputs corresponding to commands for executing different applications using the sensor unit 140, and may display execution screens of the applications using a multi window.

As described above with reference to FIGS. 5 to 8, the terminal according to an embodiment provides a user interface for receiving a figure input for performing a menu item shortcut function, thereby improving the convenience of use.

Figure 9:
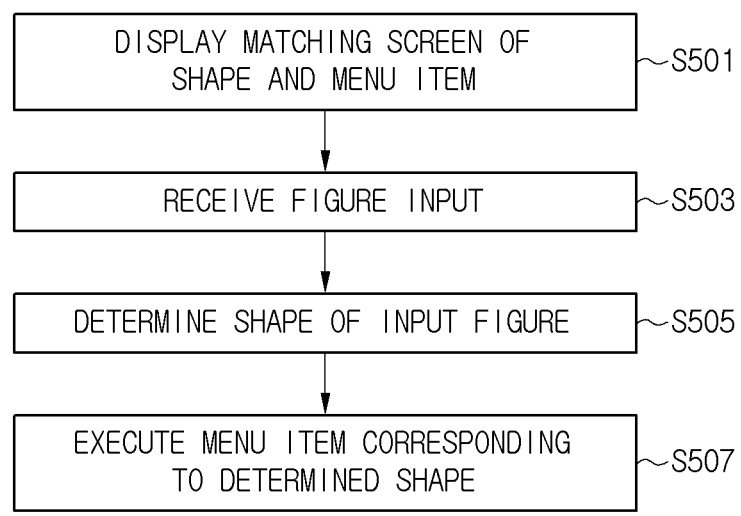
FIG. 9 is a flowchart illustrating a method for operating the terminal according to an embodiment.

FIG. 9 is a flowchart illustrating a method for operating the terminal according to an embodiment.

Referring to FIG. 9, the control unit 180 displays a shape and menu item matching screen using the display unit 151 (operation S501). The control unit 180 may receive a first figure input through the sensor unit 140 as an input for displaying the shape and menu item matching screen, but is not limited thereto. The shape and menu item matching screen will be described in detail with reference to FIG. 10.

Figure 10:
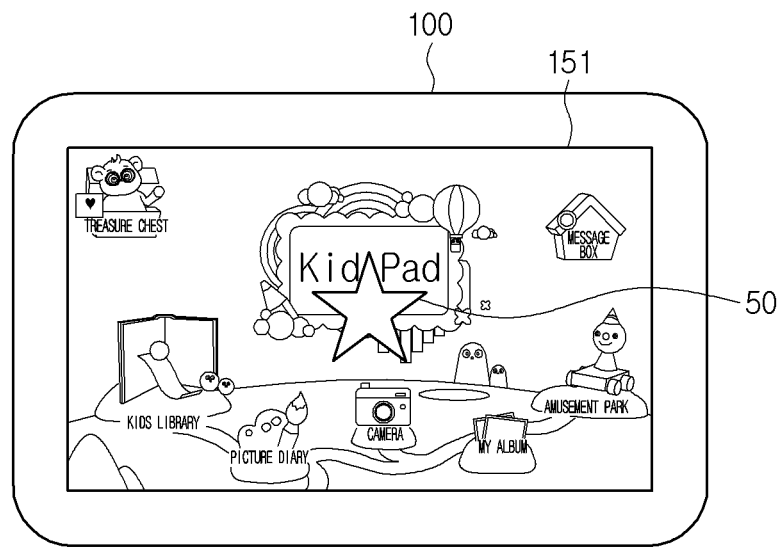
FIG. 10 is a diagram illustrating a screen of the terminal which displays a menu item and a shape matched thereto according to an embodiment.
Figure 10:
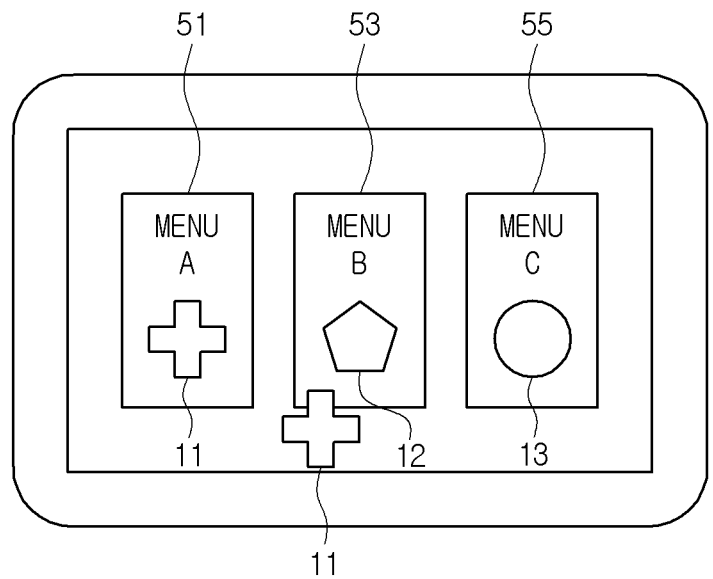

FIG. 10 is a diagram illustrating a screen of the terminal which displays a menu item and a shape matched thereto according to an embodiment.

Referring to FIG. 10A, when a user places a three-dimensional block of which a bottom side has the star shape 50 on the display unit 151 including the touch screen of the terminal 100, the control unit 180 may receive a first figure input through the infrared sensor 142. Here, the first figure input may represent a menu screen display command, and the shape of a first figure for displaying a menu screen may be predetermined according to a provider input or a user input.

The control unit 180 may display a hidden menu screen on the display unit 151 in response to the received first figure input as illustrated in FIG. 10B.

The hidden menu screen may be a menu screen for providing a menu different from that of a home screen, but is not limited thereto. The hidden menu screen according to an embodiment represents a simpler and intuitive menu screen, but is not limited thereto.

Here, regardless of the type of an execution screen displayed on the display unit 151, i.e., in the case of an execution screen other than a hidden menu screen besides a home screen, the control unit 180 may switch the screen to a hidden menu screen in response to the input of the first figure having the star shape 50.

The hidden menu screen may include a first menu icon 51, a second menu icon 53, and a third menu icon 55. In an internal region of the first menu icon 51, a title A of a first menu and a first shape 145 corresponding to the first menu may be displayed. In an internal region of the second menu icon 53, a title B of a second menu and a second shape 146 corresponding to the second menu may be displayed. In an internal region of the third menu icon 55, a title C of a third menu and a third shape 113 corresponding to the third menu may be displayed.

Description is provided below, referring back to FIG. 9.

When a figure input is received (operation S503), the control unit 180 determines the shape of an input figure (operation S505) and executes a menu item corresponding to the determined shape (operation S507).

Referring back to FIG. 10B, the control unit 180 may determine the shape of the first FIG. 145 when the first FIG. 145 that contacts the touch screen is detected by the infrared sensor 142, and may display an execution screen (not illustrated) of a first menu corresponding to the shape of the first FIG. 145, i.e., a triangle shape, on the display unit 151.

In this manner, the terminal 100 may visually guide a figure corresponding to a menu entry command so as to induce a figure input through the sensor unit 140.

Location recognition of a figure input for controlling an operation of the terminal 100 will be described with reference to FIGS. 11 to 15.

Figure 11:
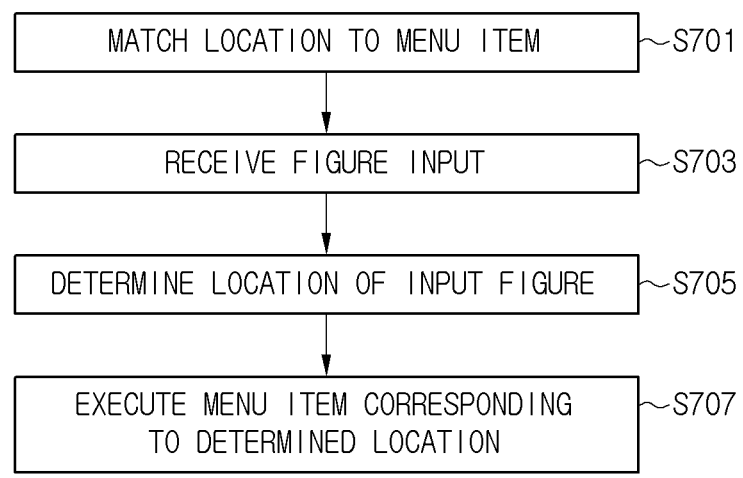
FIG. 11 is a flowchart illustrating a method for operating the terminal according to an embodiment.

FIG. 11 is a flowchart illustrating a method for operating the terminal according to an embodiment.

Referring to FIG. 11, the control unit 180 matches a location to a menu item (operation S701).

The location may represent a location where a two-dimensional figure or a three-dimensional figure is detected or a location where a user input is detected, but is not limited thereto. The location may represent at least one point or a partial region in an internal region of the display unit 151 including the touch screen, but is not limited thereto.

The control unit 180 may match the location to the menu item according to a provider input or a user input.

As described above, the menu item may include a hardware function provided by the terminal 100 and a software function provided by an application installed in the terminal 100, but is not limited thereto.

The control unit 180 may match a plurality of locations to a plurality of menu items. The plurality of locations matched to the plurality of menu items will be described with reference to FIG. 12.

Figure 12:
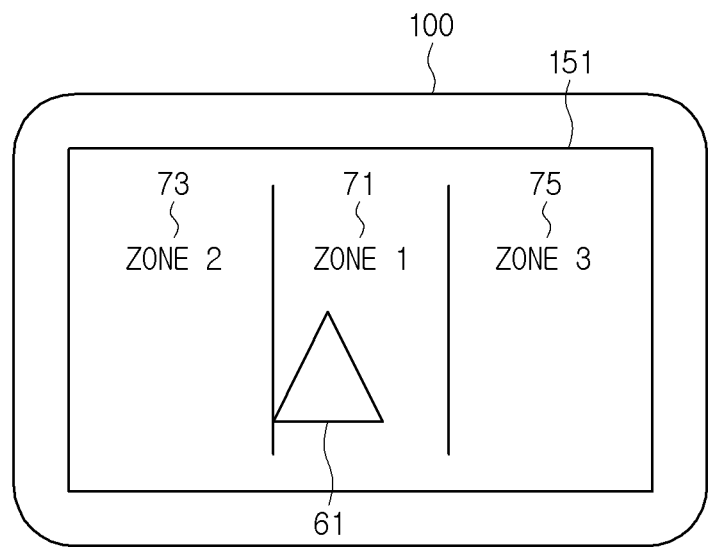
FIG. 12 is a diagram illustrating locations of figures recognized by the terminal according to an embodiment.
Figure 12:
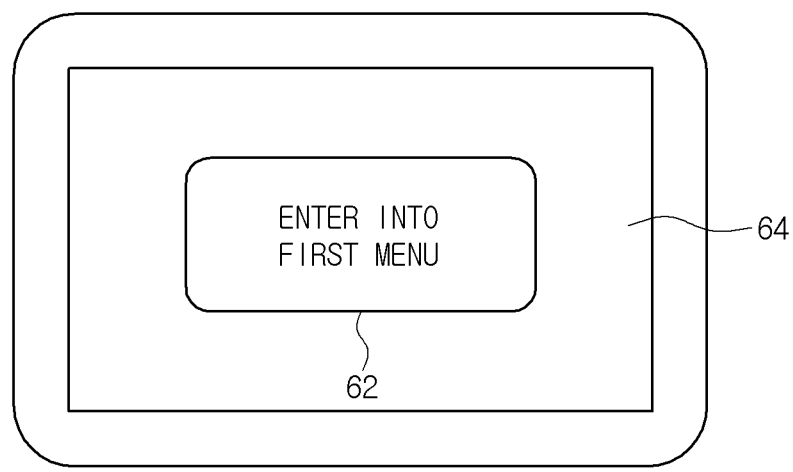

FIG. 12 is a diagram illustrating locations of figures recognized by the terminal according to an embodiment.

Referring to FIG. 12A, three different regions may be matched to three different menu items.

For example, a first region 71, a second region 73, and a third region 75 may be respectively matched to a first menu, a second menu, and a third menu provided by the terminal. Here, the first to third menus may represent different functions of the terminal 141 or different applications or may represent different pages of a single application, but is not limited thereto.

Description is provided below, referring back to FIG. 11.

When a figure input is received (operation S703), the control unit 180 determines a location of an input figure (operation S705). For example, the control unit 180 may determine the location of a corresponding object using a horizontal coordinate value and a vertical coordinate value of a touch point sensed by the infrared sensor 142.

Referring back to FIG. 12A, when a user places a three-dimensional block of which a bottom side has the triangle shape on the display unit 151 including the touch screen, the control unit 180 may receive the figure input through the infrared sensor 142.

Furthermore, the control unit 180 may receive the horizontal coordinate value and the vertical coordinate value of the touch point sensed by the infrared sensor 142 so as to determine the location of the three-dimensional block as the first region 71.

Description is provided below, referring back to FIG. 11.

The control unit 180 executes a menu item corresponding to the determined location (operation S707). The menu item corresponding to the determined location may represent the menu item matched to the location determined in operation S701 described above. The execution of the menu item corresponding to the determined location will be described in detail with reference to FIG. 12.

Referring to FIG. 12B, when a triangular object 61 is detected in the first region 71 of the touch screen, the control unit 180 may display an execution screen of the first menu corresponding to the first region 71 on the display unit 151. Here, the control unit 180 may display information 62 for notifying entry into the first menu on the display unit 151 in the form of a popup window.

In this manner, the terminal 100 may detect a location input corresponding to a command for executing a specific application or a command for executing a specific page using the sensor unit 140.

Figure 13:
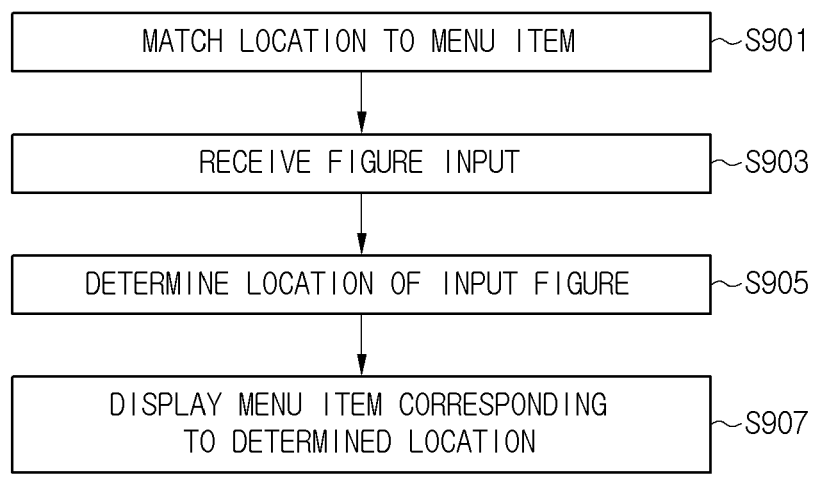
FIG. 13 is a flowchart illustrating a method for operating the terminal according to an embodiment.

FIG. 13 is a flowchart illustrating a method for operating the terminal according to an embodiment.

Referring to FIG. 13, the control unit 180 matches a location to a menu item (operation S901).

Thereafter, when a figure input is received (operation S903), the control unit 180 determines a location of an input figure (operation S905) and displays a menu item guide corresponding to the determined location (operation S907). The menu item guide corresponding to the location where an input is sensed will be described in detail with reference to FIGS. 14 and 15.

Figure 14:
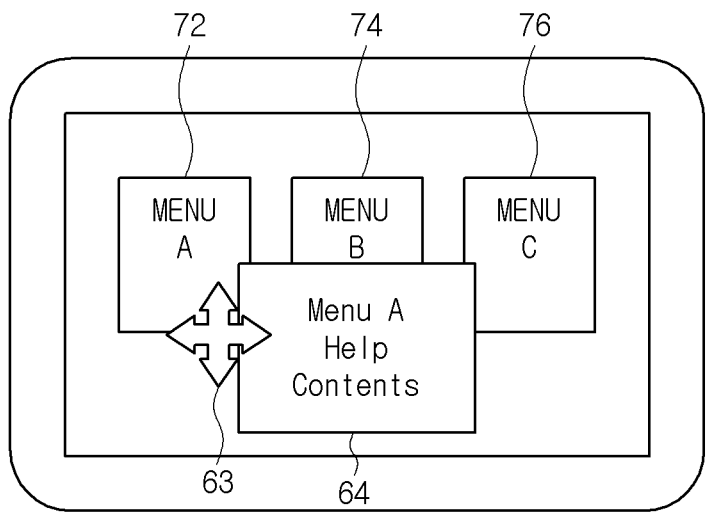
FIG. 14 is a diagram illustrating a screen of the terminal which displays a menu item according to a location of a recognized figure according to an embodiment.

FIG. 14 is a diagram illustrating a screen of the terminal which displays a menu item according to a location of a recognized figure according to an embodiment.

Referring to FIG. 14, when a user places a three-dimensional block having a predetermined shape 63 on the touch screen on which a first menu icon 72, a second menu icon 74, and a third menu icon 76 are displayed, the control unit 180 may receive an input of a figure having the predetermined shape 63 through the infrared sensor 142. Here, the figure input of the predetermined shape 63 may represent a menu guide display command.

Furthermore, while receiving the figure input of the predetermined shape 63, the control unit 180 may determine a location of an input figure as a region where the first menu icon 72 is displayed using a horizontal coordinate value and a vertical coordinate value of a touch point sensed by the infrared sensor 142. When the location of the input figure is determined, although not illustrated in the drawings, the control unit 180 may display the first menu icon 72 so that the first menu icon 72 is distinguished from the second and third menu icons 74 and 76 by thickening an edge of the first menu icon 72, but is not limited thereto.

Thereafter, when an object having the predetermined shape 63 is detected in a region where the first menu icon 72 is displayed, the control unit 180 may display guide information 64 about the first menu on the display unit 151 in the form of a popup window. Here, the guide information 64 about the first menu may be displayed on the region where the first menu icon 72 is displayed or may be displayed on a background screen instead of being displayed in the form of a popup window, but is not limited thereto.

The guide information 64 about the first menu may include information for notifying that the first menu corresponds to a help topic for specific content.

Although not illustrated in the drawings, when a user input that touches the first menu icon 72 is received while the menu item guide corresponding to the location of the figure is displayed, the control unit 180 may execute the first menu indicated by the first menu icon 72 so as to display an execution screen of the first menu on the display unit 151.

Figure 15:
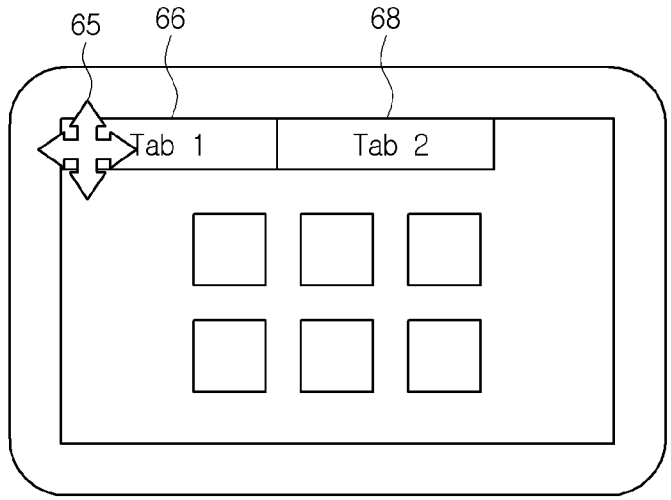
FIG. 15 is a diagram illustrating a screen of the terminal which displays a menu item according to a location of a recognized figure according to an embodiment.

FIG. 15 is a diagram illustrating a screen of the terminal which displays a menu item according to a location of a recognized figure according to an embodiment.

Referring to FIG. 15, when a user places a three-dimensional block having a predetermined shape 65 on an upper edge in the touch screen, the control unit 180 may receive a figure input of the predetermined shape 65 through the infrared sensor 142. Here, the figure input of the predetermined shape 65 detected at the upper edge may represent a hidden tab menu display command.

Furthermore, while receiving the figure input of the predetermined shape 65, the control unit 180 may determine a location of the input figure as the upper edge in the touch screen using a horizontal coordinate value and a vertical coordinate value of a touch point sensed by the infrared sensor 142.

Thereafter, when an object having the predetermined shape 63 is detected in the upper edge in the touch screen, the control unit 180 may display a hidden tab menu on the display unit 151. Here, the hidden tab menu may be displayed on the upper edge where the predetermined shape 63 has been detected, but is not limited thereto.

The hidden tam menu may include a plurality of tabs 66 and 68 which may indicate different categories.

Although not illustrated in the drawings, when a user input that touches the first tab 66 is received while the hidden tab menu is displayed, the control unit 180 may display at least one menu list provided from the category indicated by the first tab 66 on the display unit 151, but is not limited thereto.

An operation of the terminal 100 for the case of an inappropriate figure input will be described with reference to FIGS. 16 and 17.

Figure 16:
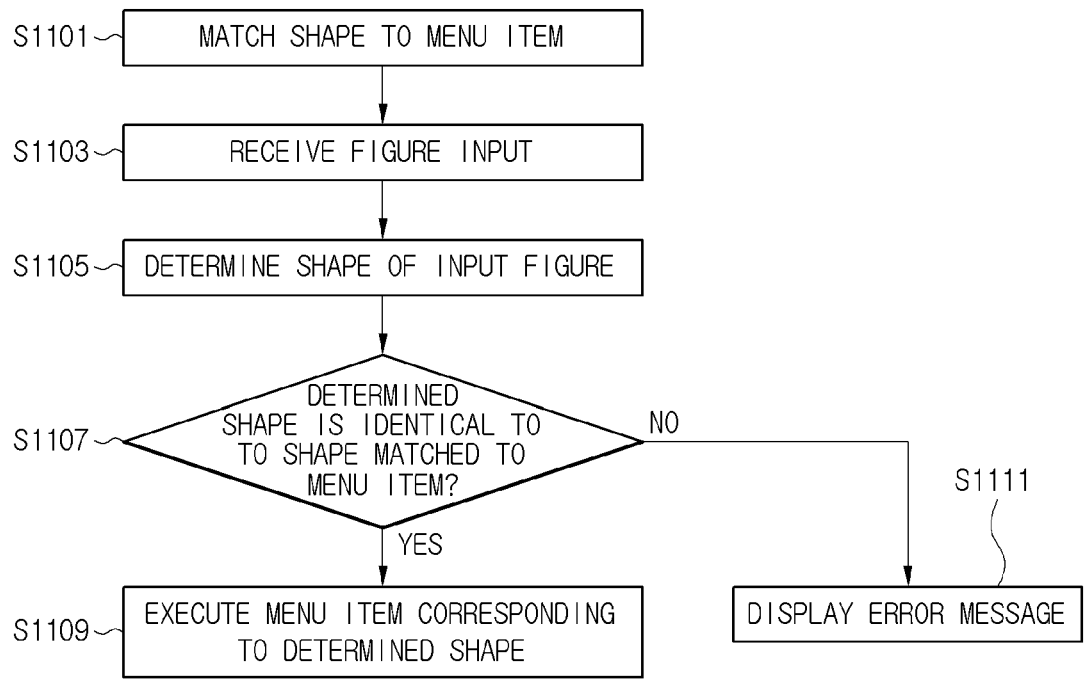
FIG. 16 is a flowchart illustrating a method for operating the terminal according to an embodiment.

FIG. 16 is a flowchart illustrating a method for operating the terminal according to an embodiment.

Referring to FIG. 16, the control unit 180 matches a shape to a menu item (operation S1101). As described above, the control unit 180 may match a plurality of shapes to a plurality of menu items.

Thereafter, when a figure input is received (operation S1103), the control unit 180 determines a shape of an input figure (operation S1105) and determines whether the determined shape is identical to the shape that has been matched, in operation S1101, to the menu item (operation S1107).

Here, the control unit 180 may determine whether the determined shape is identical to one of a plurality of shapes matched to a plurality of menu items. The case where the shape of the input figure is determined as not being matched to a menu item will be described in detail with reference to FIG. 17.

Figure 17:
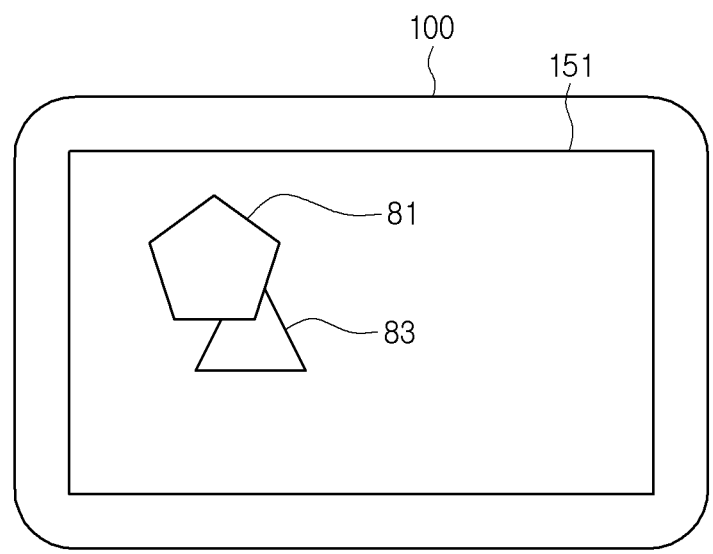
FIG. 17 is a diagram illustrating a screen of the terminal that has failed to recognize a figure according to an embodiment.
Figure 17:
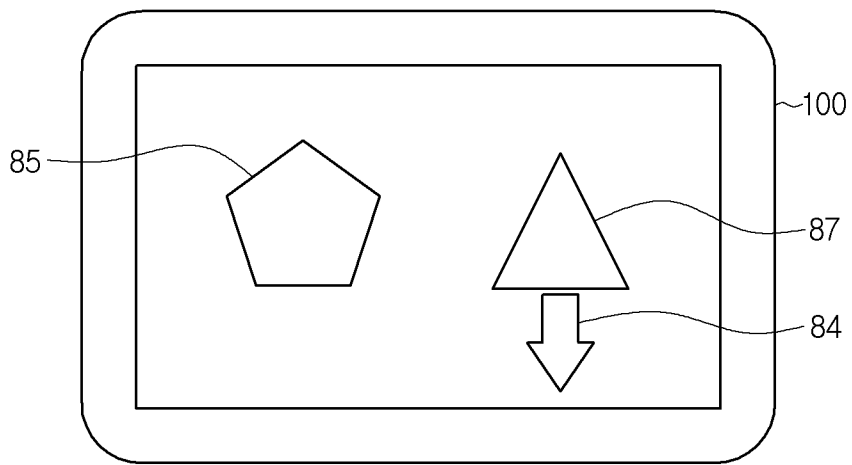
Figure 17:
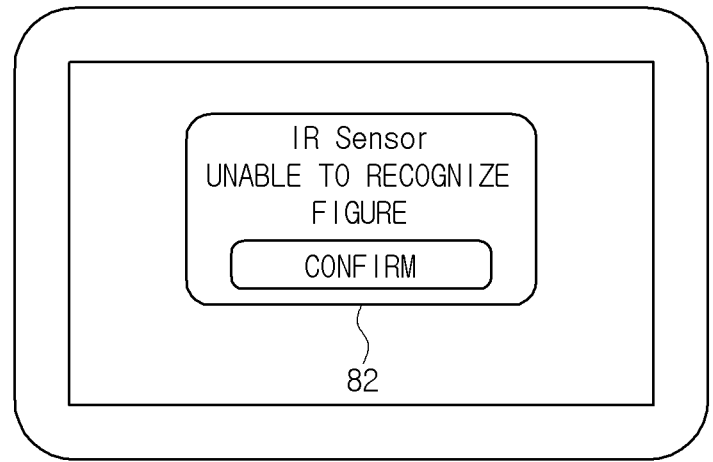

FIG. 17 is a diagram illustrating a screen of the terminal that has failed to recognize a figure according to an embodiment.

Referring to FIG. 17A, when a user places a three-dimensional block of which a bottom side has a pentagon shape 81 and a three-dimensional block of which a bottom side has a triangle shape 83 so that the three-dimensional blocks overlap each other, the control unit 180 may receive an input of a figure having a shape obtained by overlapping a pentagon and a triangle.

If a shape pre-matched to a menu item by a provider input or a user input is based on an input of a single figure, a shape of a figure determined by the control unit 180 may not be identical to a shape matched to a menu item.

However, if a shape pre-matched to a menu item by a provider input or a user input is also based on an input of the figure illustrated in FIG. 17A, a shape of a figure determined by the control unit 180 may be identical to a shape matched to a menu item.

Referring to FIG. 17B, when a user simultaneously places a three-dimensional block of which a bottom side has a pentagon shape 85 and a three-dimensional block of which a bottom side has a triangle shape 87, the control unit 180 may simultaneously receive an input of a figure having a pentagon shape and an input of a figure having a triangle shape.

Here, as illustrated in FIG. 17B, when a vertical coordinate value of the pentagon shape 85 detected by the infrared sensor 142 is identical to a vertical coordinate value of the triangle shape 87, the control unit 180 may determine that a shape of a detected figure is not identical to a shape matched to a menu item. Although not illustrated in the drawings, when a horizontal coordinate value of the pentagon shape 85 detected by the infrared sensor 142 is identical to a horizontal coordinate value of the triangle shape 87, the control unit 180 may determine that a shape of a detected figure is not identical to a shape matched to a menu item.

However, even though the vertical coordinate value of the pentagon shape 85 detected by the infrared sensor 142 is identical to the vertical coordinate value of the triangle shape 87, the control unit 180 may determine that a shape of a detected figure is identical to a shape matched to a menu item if the horizontal coordinate value of the pentagon shape 85 is different from the horizontal coordinate value of the triangle shape 87. Likewise, even though the horizontal coordinate value of the pentagon shape 85 detected by the infrared sensor 142 is identical to the horizontal coordinate value of the triangle shape 87, the control unit 180 may determine that a shape of a detected figure is identical to a shape matched to a menu item if the vertical coordinate value of the pentagon shape 85 is different from the vertical coordinate value of the triangle shape 87.

Description is provided below, referring back to FIG. 16.

The control unit 180 executes a menu item corresponding to the determined shape if the determined shape is determined as being identical to the shape matched to the menu item (operation S1109), or displays an error message if the determined shape is determined as being different from the shape matched to the menu item (operation S1111).

The control unit 180 may execute the menu item corresponding to the determined shape, and may display a plurality of menu items corresponding to a plurality of shapes on the display unit 151 using a multi window.

On the contrary, referring to FIG. 17C, the control unit 180 may display an error message 82 if it is determined that there is no menu item matched to the shape of the input figure.

The error message 82 may include a confirmation button and information for notifying that an input figure is unable to be recognized using the infrared sensor 142 provided to the terminal. When a user selects the confirmation button, displaying of the error message 82 may be stopped.

When the vertical coordinate value of the pentagon shape 85 detected by the infrared sensor 142 is identical to the vertical coordinate value of the triangle shape 87, the control unit 180 may display an indicator 84 for indicating a direction in the vicinity of the triangle shape 87. Here, if a user moves the three-dimensional block having the triangle shape 87 in the direction indicated by the indicator 84, the control unit 180 may determine the pentagon shape 85 and the triangle shape 87 from a plurality of figure inputs, and then may execute menu items corresponding to the determined shapes, and may display a plurality of menu items corresponding to a plurality of shapes on the display unit 151 using a multi window, but is not limited thereto.

Figure 18:
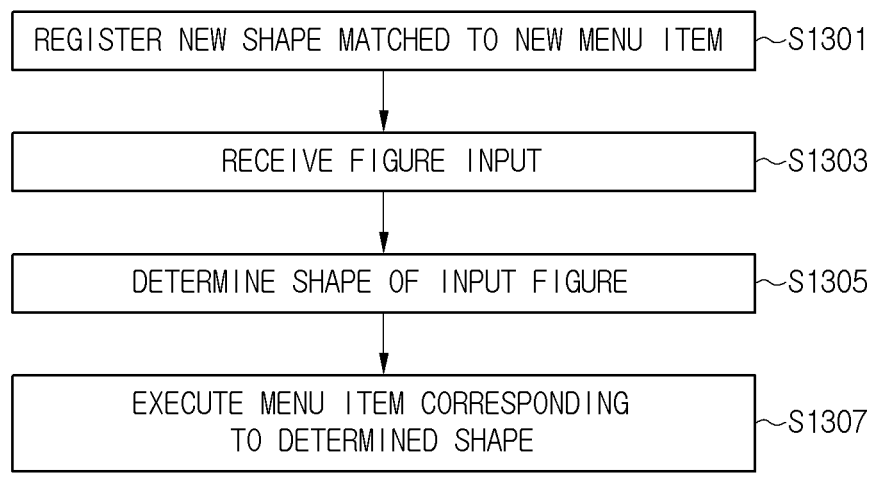
FIG. 18 is a flowchart illustrating a method for operating the terminal according to an embodiment.

FIG. 18 is a flowchart illustrating a method for operating the terminal according to an embodiment.

Referring to FIG. 18, the control unit 180 registers a new shape matched to a new menu item (operation S1301). The control unit 180 may allow a user to customize a figure by registering a new shape corresponding to a new menu item according to a user input. The registration of a new shape corresponding to a new item will be described in detail with reference to FIG. 19.

Figure 19:
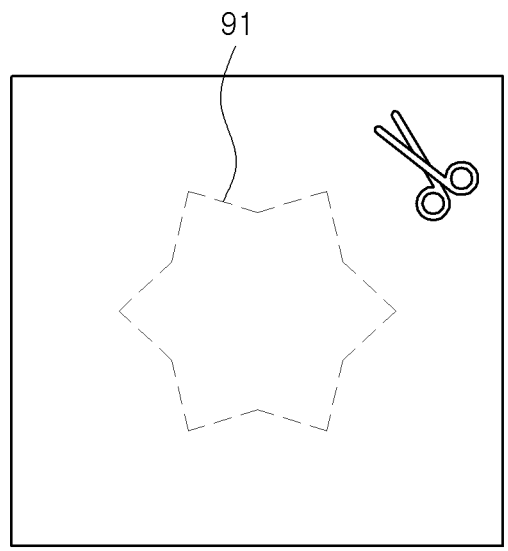
FIG. 19 is a diagram for describing registration of a figure and an operation of the terminal recognizing the registered figure.
Figure 19:
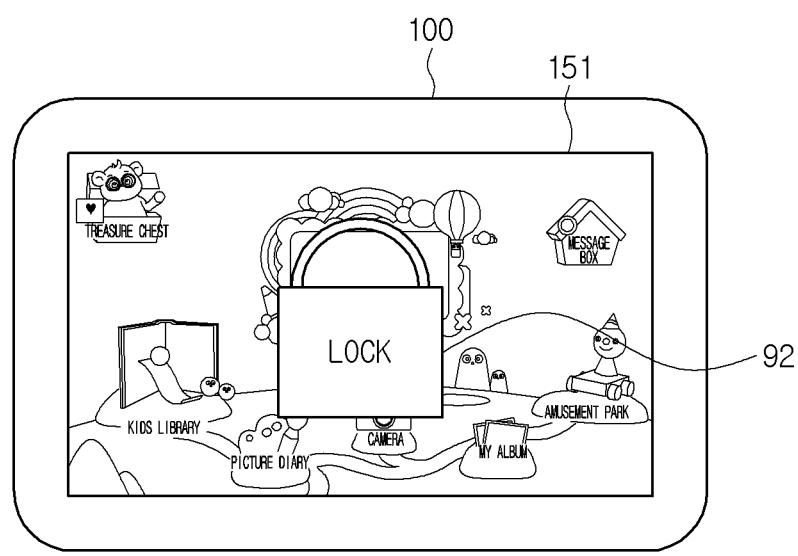

FIG. 19 is a diagram for describing registration of a figure and an operation of the terminal recognizing the registered figure.

For example, the control unit 180 may match the dodecagon shape illustrated in FIG. 19A to an unlocking item according to a user input.

Alternatively, the control unit 180 may change the matching state between the shape and the menu item illustrated in FIG. 6A according to a user input, but is not limited thereto.

Description is provided below, referring back to FIG. 18.

When an input of a figure having the new shape registered in operation S1301 is received (operation S1303), the control unit 180 determine a shape of the input figure (operation S1305), and then executes a menu item corresponding to the determined shape (operation S1307).

Referring to FIG. 19, when a shape of a figure detected on the touch screen on which a locking screen is displayed as illustrated in FIG. 19B is determined as the dodecagon shape illustrated in FIG. 19A, the control unit 180 may perform screen unlocking that is a menu item corresponding to the dodecagon shape. As described above, the terminal 100 according to an embodiment may allow a user to unlock a screen by placing a three-dimensional block selected by the user on the touch screen without using a password, thereby improving ease of use.

Hereinafter, a method for operating the terminal according to another embodiment will be described.

Figure 20:
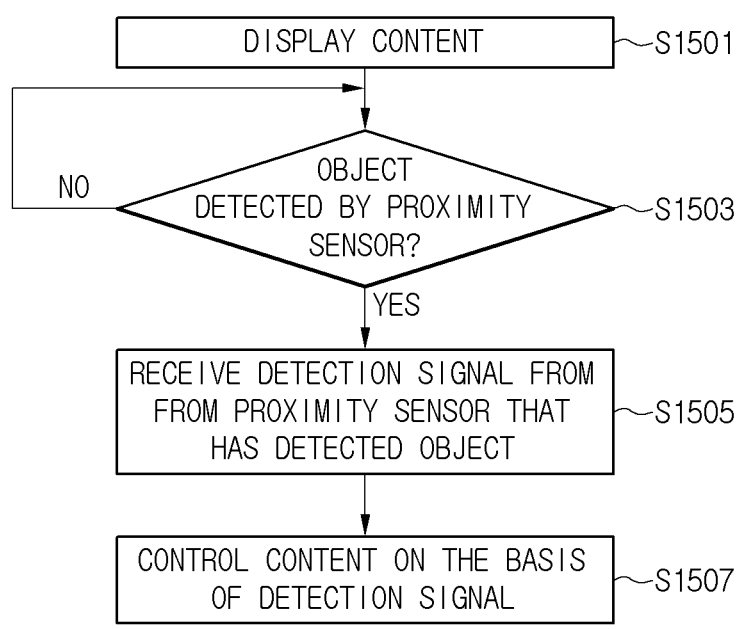
FIG. 20 is a flowchart illustrating a method for operating the terminal according to another embodiment.

FIG. 20 is a flowchart illustrating a method for operating the terminal 100 according to another embodiment.

The display unit 151 displays content according to a request of a user (operation S1501). For example, the display unit 151 displays game content requested by the user from among various pieces of game content (e.g., game programs). The various pieces of game content (e.g., game programs) are stored in the memory 160.

The control unit 180 determines which one or more of the plurality of proximity sensors 141 have detected an object (operation S1503). A proximity sensor that has detected the object, among the plurality of proximity sensors 141, generates a detection signal, and the generated detection signal is transferred to the control unit 180.

The control unit 180 receives the detection signal transferred by the proximity sensor that has detected the object (operation S1505).

The control unit 180 controls content on the basis of the received detection signal (operation S1507). For example, the control unit 180 controls game content on the basis of the received detection signal.

Figure 21:
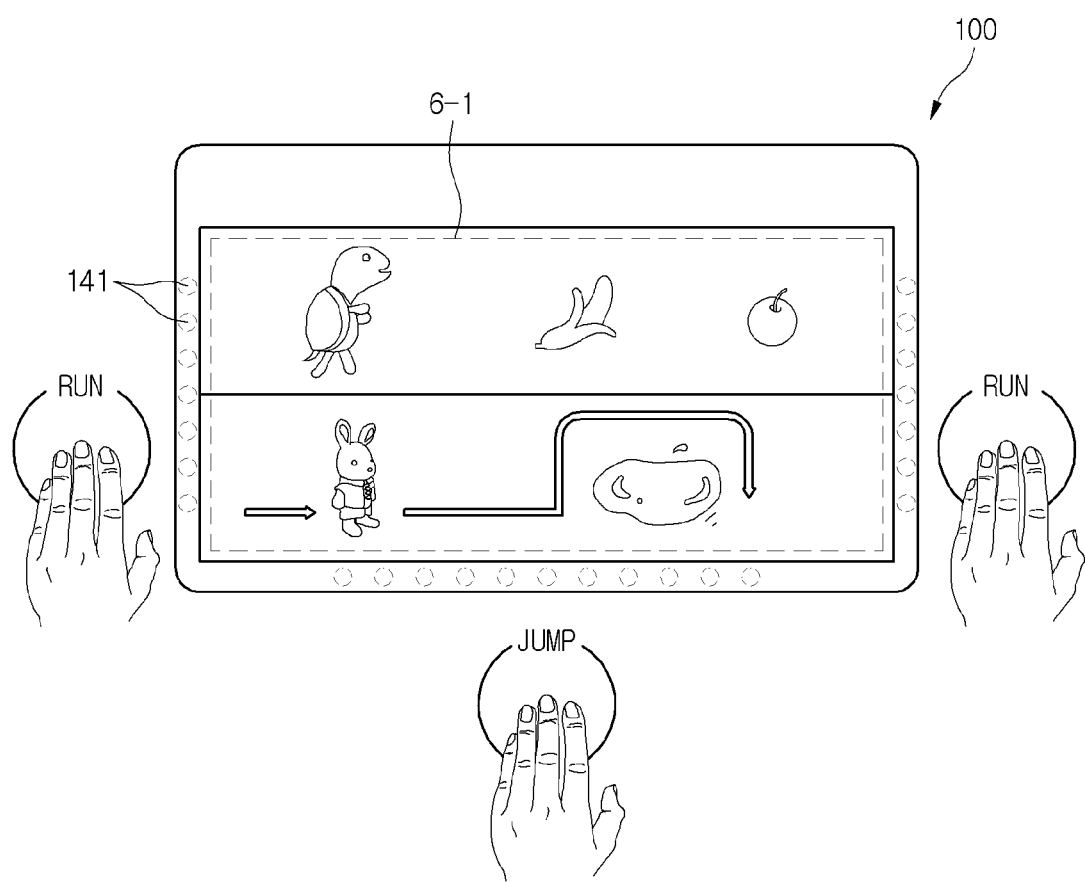
FIG. 21 is a diagram exemplarily illustrating a method of controlling content on the basis of a detection signal according to another embodiment.

FIG. 21 is a diagram illustrating an example of a method of controlling content on the basis of a detection signal according to an embodiment.

As illustrated in FIG. 21, when hurdle race game content 6-1 is displayed on the display unit 151, the control unit 180 receives a first detection signal generated by the first sensor 145 in response to tapping on an object detection region of the first sensor 135 by a user, receives a second detection signal generated by the second sensor 146 in response to tapping on an object detection region of the second sensor 146 by the user, and displays a running motion of a character in the hurdle race game content 601 on the basis of the first and second detection signals. The control unit 180 receives a third detection signal generated by the third proximity sensor in response to tapping on an object detection region of the third sensor 147 by the user, and displays a jumping motion of the character in the hurdle race game content 6-1 on the basis of the third detection signal.

Figure 22:
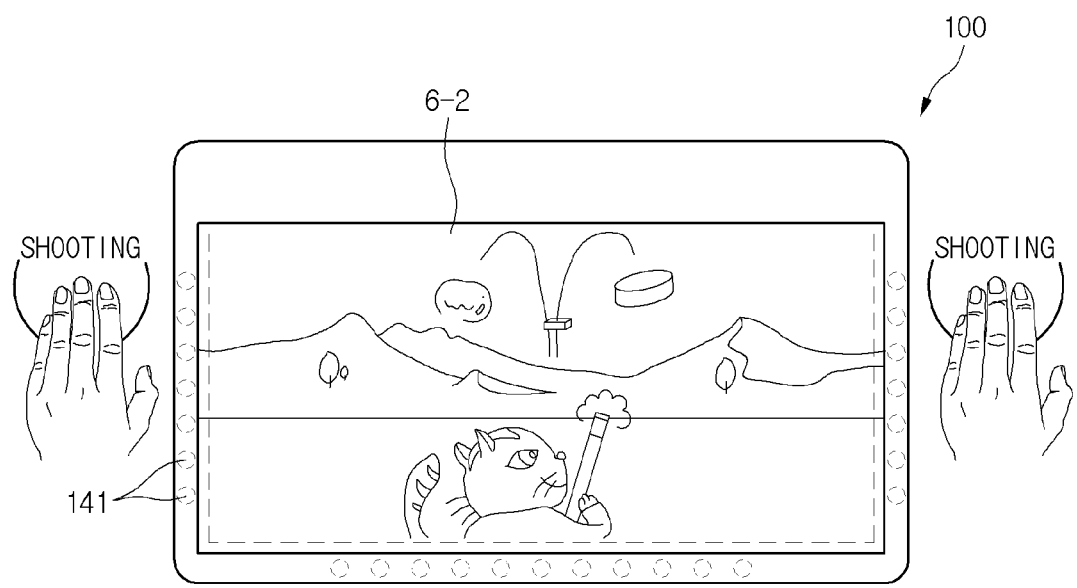
FIG. 22 is a diagram exemplarily illustrating a method of controlling content on the basis of a detection signal according to another embodiment.

FIG. 22 is a diagram illustrating another example of the method of controlling content on the basis of a detection signal according to an embodiment.

As illustrated in FIG. 22, when shooting game content 6-2 is displayed on the display unit 151, the control unit 180 receives a first detection signal generated by the first sensor 145 in response to tapping on an object detection region of the first sensor 135 by a user, receives a second detection signal generated by the second sensor 146 in response to tapping on an object detection region of the second sensor 146 by the user, and displays a shooting motion of a character in the shooting game content 6-2 on the basis of the first and second detection signals. The control unit 180 may control various pieces of game content in addition to the game content illustrated in FIGS. 21 and 22, on the basis of a detection signal.

Therefore, the terminal 100 according to an embodiment may correctly control content on the basis of a detection signal obtained by detecting an object by the plurality of proximity sensors 141 provided to the terminal 100.

Since the terminal 100 according to an embodiment controls content on the basis of a detection signal obtained by detecting an object by the plurality of proximity sensors 141 provided to the terminal 100, a user does not need to continuously press a button of the terminal in order to play a game, and thus, a breakdown of the button may be prevented.

Figure 23:
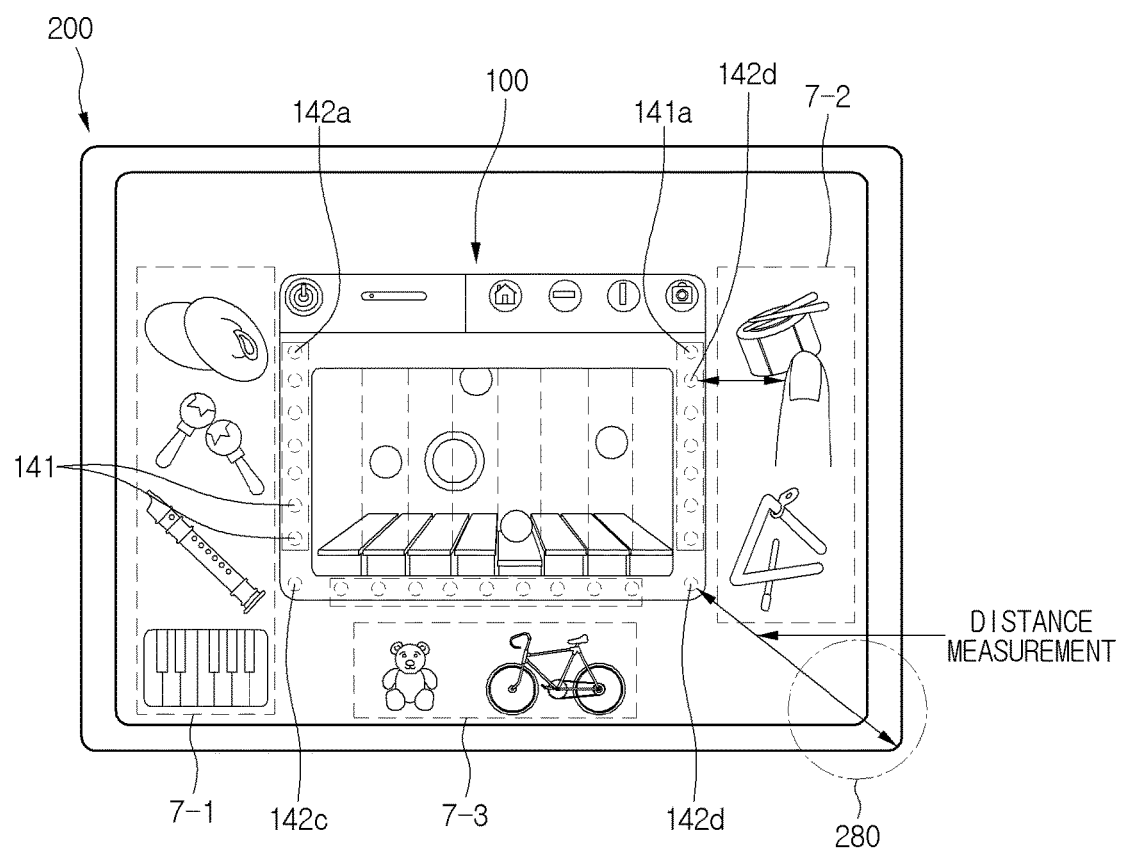
FIG. 23 is a diagram exemplarily illustrating a terminal according to another embodiment.

FIG. 23 is a block diagram illustrating a terminal 100 according to another embodiment.

As illustrated in FIG. 23, the terminal 100 according to another embodiment may further include a content pad 200 detachable from the terminal 100. The height of the content pad 200 may be smaller than that of the terminal 100 so that the proximity sensor 141 detects an object (e.g., a hand or a finger of a user).

Various items (e.g., book pictures, triangle pictures, vehicle pictures, and piano pictures) 7-1, 7-2 and 7-3 corresponding to game content may be displayed on the content pad 200. The control unit 180 pre-stores each location information of the various items displayed on the content pad 200 in the memory 160. For example, when a user taps on a first item (e.g., a book picture) among the plurality of items displayed on the content pad 200, a proximity sensor 141a located adjacent to the first item outputs a detection signal to the control unit 180. The control unit 180 receives the detection signal from the proximity sensor 141a, and controls content corresponding to the first item on the basis of the received detection signal. That is, the control unit 180 receives the detection signal from the proximity sensor 141a located adjacent to a book picture, and outputs a sound of a drum through the sound output module 152 on the basis of the received detection signal.

When a user taps on a second item (e.g., a triangle picture) among the plurality of items displayed on the content pad 200, a proximity sensor located adjacent to the second item outputs a detection signal to the control unit 180. The control unit 180 receives the detection signal from the proximity sensor, and controls content corresponding to the second item on the basis of the received detection signal. The control unit 180 receives the detection signal from the proximity sensor located adjacent to a triangle picture, and outputs a sound of a triangle through the sound output module 152 on the basis of the received detection signal.

When an item of the content pad 200 does not exist in the vicinity of at least one of the first to third sensors 145 to 147, the control unit 180 may turn off at least one of the sensors 145 to 147 so as to reduce power consumption of the plurality of proximity sensors. For example, when an item of the content pad 200 does not exist at a location adjacent to the left side of the terminal 100, the control unit 180 may turn off the first sensor 145 so as to reduce the power consumption of the proximity sensors.

The terminal 100 according to another embodiment may detect a distance between the terminal 100 and the content pad 200. For example, the terminal 100 according to another embodiment may detect a distance between a corner end portion of the terminal 100 and that of the content pad 200. The proximity sensor 141 may further include a plurality of proximity sensors 142a to 142d for detecting a distance. The proximity sensors 142a to 142d may be installed at quoins (e.g., corner sides) of the terminal 100 respectively. Alternatively, only one of the proximity sensors 142a to 142d may be installed at a corner side of the terminal 100.

The proximity sensors 142a to 142d may be installed at various locations of the terminal 100.

Figure 24:
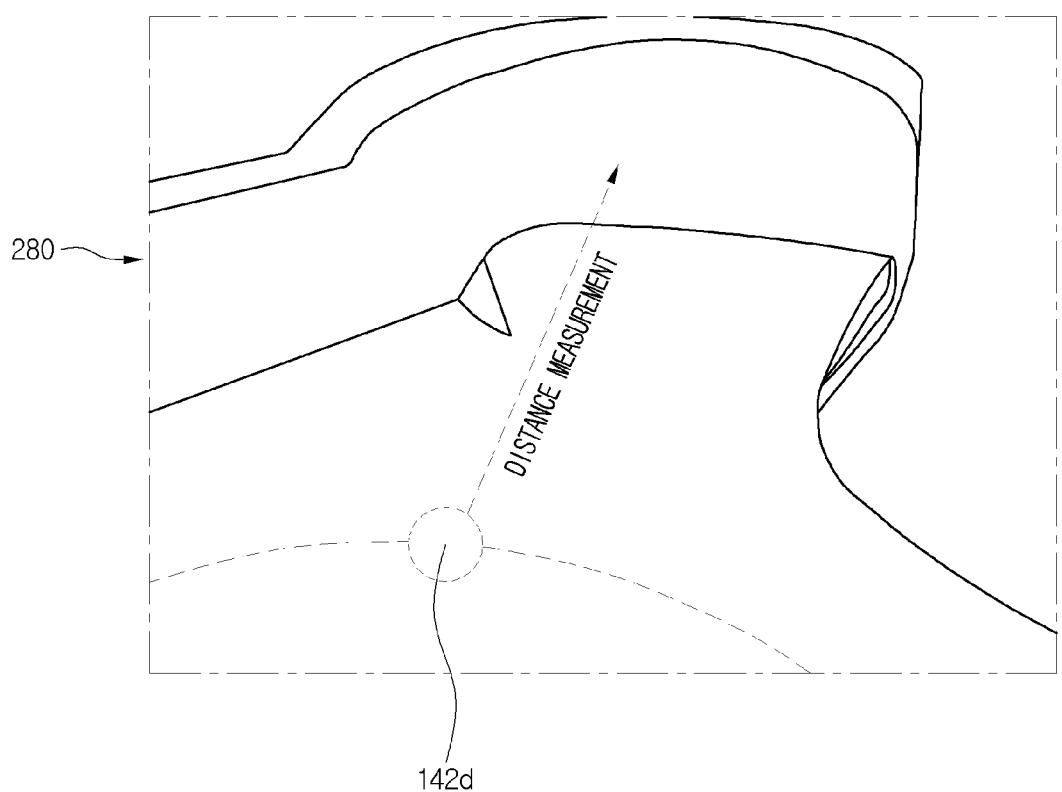
FIG. 24 is a block diagram exemplarily illustrating a part of a content pad attached to the terminal according to another embodiment.

FIG. 24 is a block diagram exemplarily illustrating a part of the content pad attached to the terminal 100 according to another embodiment.

As illustrated in FIG. 24, the proximity sensor 142d for detecting a distance to the content pad 200 detects a distance to an inner corner side of the content pad 200, and transfers a detected distance (distance value) to the control unit 180. The proximity sensor 142d may detect a distance to any point on the inner side of the content pad 200. The terminal 100 according to another embodiment may include an optical guide for guiding light emitted from the proximity sensors 142a to 142d so as to detect the distance to the content pad 200. For example, the optical guide connected to the proximity sensors 142a to 142d may be installed so that the optical guide faces an inner corner side of the content pad 200.

The terminal 100 according to another embodiment may detect not only the distance to the content pad 200 but also detect a length of an inner corner side of the content pad 200, and may determine a type of the content pad 200 on the basis of the detected length. For example, a plurality of proximity sensors may be arranged in a row at each corner side of the terminal 100 according to another embodiment, and the proximity sensors detect the length of each inner corner side of the content pad 200.

Figure 25:
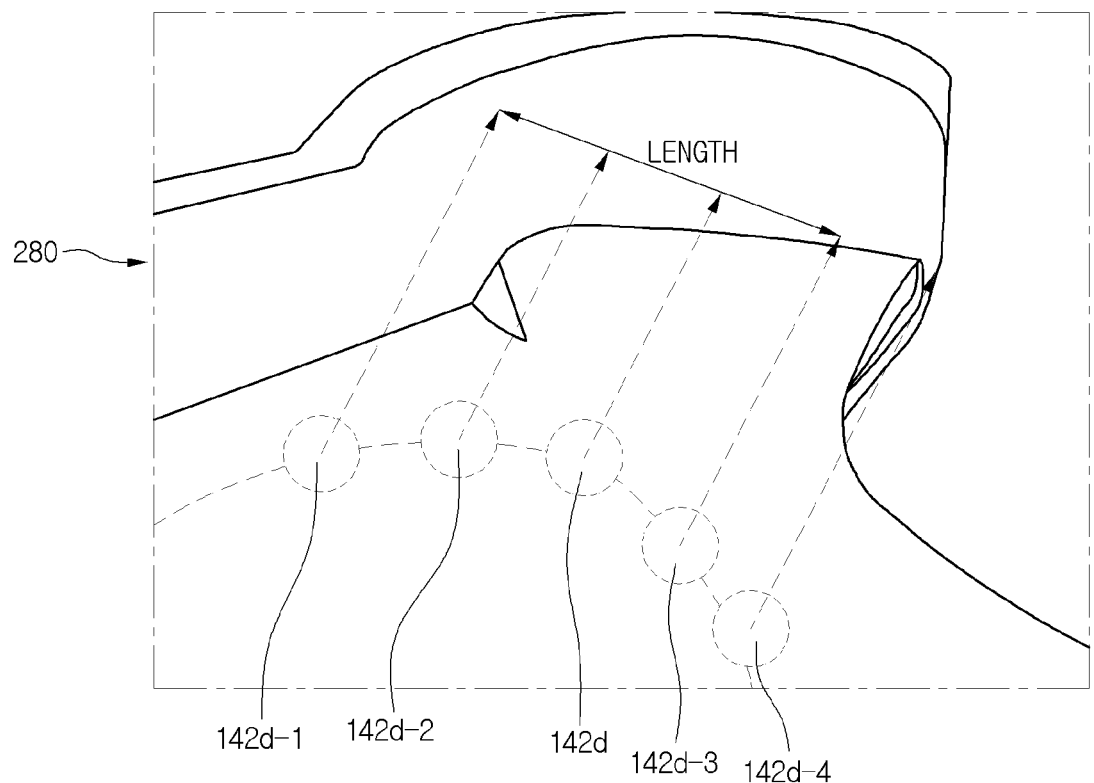
FIG. 25 is a block diagram exemplarily illustrating a method of detecting a length of a content pad attached to the terminal according to another embodiment.

FIG. 25 is a block diagram exemplarily illustrating a method of detecting a length of the content pad attached to the terminal 100 according to another embodiment.

As illustrated in FIG. 25, the control unit 180 may detect a length of each inner corner side of the content pad 200 using a plurality of proximity sensors 142d-1, 142d-2, 142d, 142d-3 and 142d-4 arranged in a row at corner sides of the terminal 100 according to another embodiment, and may determine the type of the content pad 200 on the basis of the detected length. Distances among the plurality of proximity sensors 142d-1, 142-2, 1142d, 142d-3 and 142d-4 may be preset by the control unit 180.

For example, when three proximity sensors (e.g., 142d-1, 142d-2 and 142d) among the five proximity sensors 142d-1, 142d-2, 142d, 142d-3 and 142d-4 arranged at a corner side of the terminal 100 detect an object, and the two other proximity sensors 142d-3 and 142d-4 do not detect an object, the control unit 180 may determine that a length of an inner corner side of the content pad 200 is 3 cm if an arrangement length of the three proximity sensors 142d-1, 142d-2 and 142d is 3 cm. The control unit 180 may determine the type of the attached content pad 200 on the basis of the detected length. For example, if the detected length has a first length value, the control unit 180 may determine that the attached content pad 200 has such a type that the content pad 200 includes items related to hurdle race game content 6-1. For another example, if the detected length has a second length value, the control unit 180 may determine that the attached content pad 200 has such a type that the content pad 200 includes items related to shooting game content 6-2. The first and second length values may be variously changed by a designer.

Figure 26:
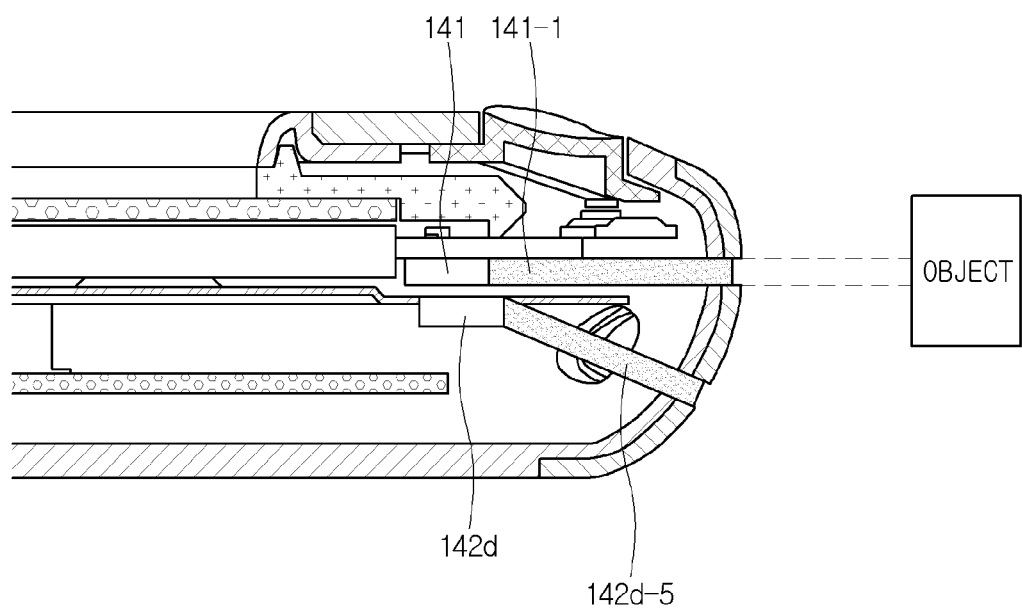
FIG. 26 is a block diagram exemplarily illustrating an optical guide according to another embodiment.

FIG. 26 is a block diagram exemplarily illustrating an optical guide according to another embodiment.

As illustrated in FIG. 26, each proximity sensor (e.g., 142*d*) arranged in the terminal 100 according to another embodiment may include an optical guide 142*d*-5 for guiding light emitted from each proximity sensor (e.g., 142*d*). By emitting light or receiving light reflected from an object through the optical guide 142*d*-5, a distance to an object may be correctly detected.

A light absorbing member for reducing reflection of light emitted through the optical guide 142*d*-5 connected to a proximity sensor (e.g., 142*d*) may be arranged on a inner corner side of the content pad 200 which opposes the optical guide 142*d*-5. For example, when the content pad 200 is not attached to the terminal 100, the proximity sensor (e.g., 142*d*) may detect a distance to a floor on which the terminal 100 is placed. The light absorbing member may include a black plate and a black fabric.

Therefore, since an amount of light reflected by the light absorbing member is smaller than that of light reflected by the floor, the control unit 180 may recognize the attachment of the content pad 200 if an amount of light received by the proximity sensor (e.g., 142*d*) is the same as or similar to a preset reference value corresponding to the amount of light reflected by the light absorbing member. On the contrary, if the amount of light received by the proximity sensor (e.g., 142*d*) is different from the preset reference value, the control unit 180 determines that the content pad 200 has been detached.

Each of the plurality of proximity sensors 142*d*, 142*d*-1, 142*d*-2, 142*d*-3 and 142*d*-4 may include an optical guide for guiding light.

Figure 27:
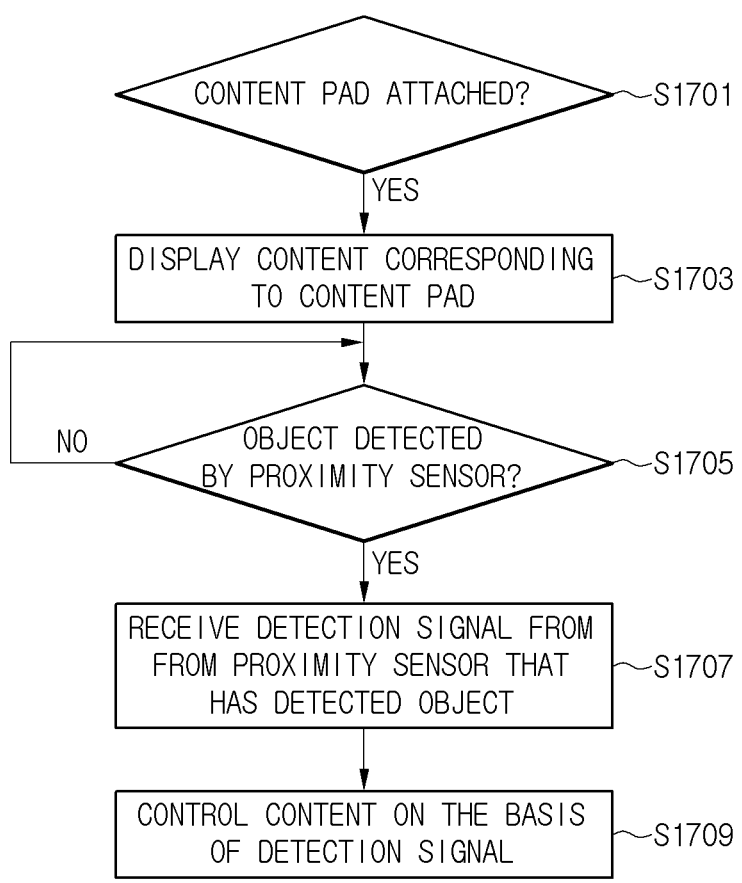
FIG. 27 is a flowchart illustrating a method for operating the terminal according to another embodiment.

FIG. 27 is a flowchart illustrating a method for operating the terminal 100 according to another embodiment.

The control unit 180 determines whether the content pad 200 is attached to the terminal 100. For example, the control unit 180 may determine that the content pad 200 has been attached to the terminal 100 if the amount of light received by the proximity sensor (e.g., 142*d*) is the same as or similar to the preset reference value. On the contrary, if the amount of light received by the proximity sensor (e.g., 142*d*) is different from the preset reference value, the control unit 180 may determine that the content pad 200 has been detached.

The control unit 180 detects a distance between the content pad 200 and the terminal 100 using the proximity sensor (e.g., 142*d*). For example, the proximity sensor 142*d* for detecting a distance to the content pad 200 detects a distance between a corner of the terminal 100 and a corner of the content pad 200, and transfers a value of the detected distance to the control unit 180.

The control unit 180 determines the type of the content pad 200 on the basis of the detected distance value. For example, if the detected distance value is a first distance value, the control unit 180 may determine that the attached content pad 200 has such a type that the content pad 200 includes items related to hurdle race game content 6-1. For another example, if the detected distance value is a second distance value, the control unit 180 may determine that the attached content pad 200 has such a type that the content pad 200 includes items related to shooting game content 6-2. The first and second distance values may be variously changed by a designer.

The control unit 180 retrieves content corresponding to the determined type of the content pad from the memory 160, and displays the retrieve content on the display unit 151 (operation S1703). For example, if the detected distance value is the first distance value, the control unit 180 displays the hurdle race game content 6-1 on the display unit 151, and, if the detected distance value is the second distance value, the control unit 180 displays the shooting game content 6-2 on the display unit 151.

The control unit 180 determines which one or more of the plurality of proximity sensors 141 have detected an object (operation S1705). A proximity sensor that has detected the object, among the plurality of proximity sensors 141, outputs a detection signal, and the output detection signal is transferred to the control unit 180.

The control unit 180 receives the detection signal generated by the proximity sensor that has detected the object (operation S1707).

The control unit 180 controls content on the basis of the received detection signal (operation S1709). For example, the control unit 180 controls game content requested by a user on the basis of the received detection signal.

Figure 28:
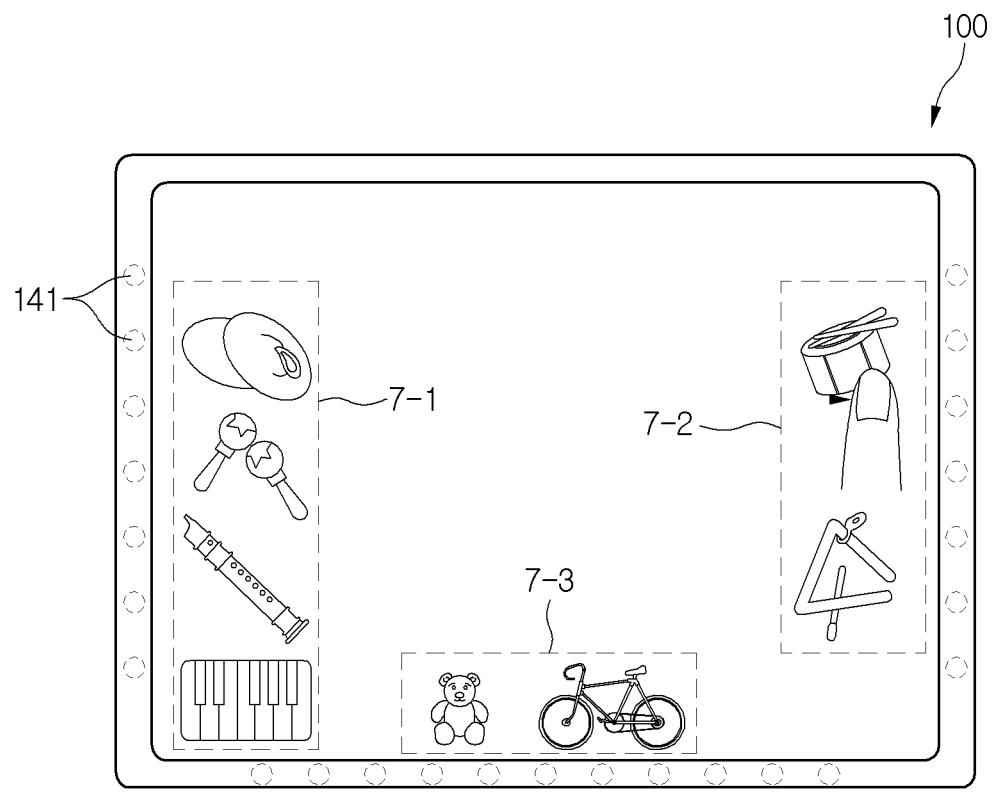
FIG. 28 is a block diagram illustrating a terminal according to another embodiment.

FIG. 28 is a block diagram illustrating a terminal 100 according to another embodiment.

As illustrated in FIG. 28, the control unit 180 may display, on the display unit 151, the various items (e.g., book pictures, triangle pictures, vehicle pictures, and piano pictures) 7-1, 7-2 and 7-3 displayed on the content pad 200 when the content pad 200 is detached. For example, when the content pad 200 including the items related to the hurdle race game content 6-1 is attached and then is detached by a user, the control unit 180 may display the items (e.g., book pictures, triangle pictures, vehicle pictures and piano pictures) 7-1, 7-1 and 7-3 related to the hurdle race game content 6-1 on the display unit 151.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

According to an embodiment, the above-mentioned methods may be implemented as processor-readable codes in a program-recorded medium. The processor-readable recording medium includes, for example, a ROM, a RAM, a CD-ROM, a magnetic tape, a floppy disk, and an optical data storage device, and may also be implemented in the form of a carrier wave (for example, transmission via the Internet).

The above-mentioned terminals are not limited to the configuration and methods of the above-mentioned embodiments. The entirety or part of the embodiments may be selectively combined with each other to make various medications.

What is claimed is:

1. A method for operating a terminal detecting an object that contacts the terminal, the method comprising:
    detecting a content pad attached to the terminal, wherein the content pad is detached from or attached to the terminal;
    determining an operation of the terminal corresponding to the detected object; and
    performing the determined operation of the terminal, wherein the determining the operation of the terminal corresponding to the detected object includes:

determining a type of the attached content pad;
retrieving content corresponding to the determined type of the content pad; and
determining the operation of the terminal corresponding to the retrieved content.

2. The method according to claim 1, wherein the determining the type of the attached content pad includes:
detecting a distance between the terminal and the content pad; and
determining the type of the content pad on the basis of the detected distance.

3. The method according to claim 1, wherein the performing the determined operation of the terminal includes;
executing the content corresponding to the type of the content pad;
receiving a user input for controlling the content; and
performing the operation of the terminal for the content according to the received user input.

4. A terminal for detecting an object that contacts the terminal, the terminal comprising:
a proximity sensor module configured to detect a content pad attached to the terminal, wherein the content pad is detached from or attached to the terminal; and
a controller that determines a type of the attached content pad, retrieves content corresponding to the determined type of the content pad, determines the operation of the terminal for the retrieved content, and perform the determined operation of the terminal.

5. The terminal according to claim 4, wherein the proximity sensor module detects a distance between the terminal and the attached content pad, and the controller determines the type of the terminal on the basis of the detected distance.

6. The terminal according to claim 4, wherein the proximity sensor module receives a user input for controlling the content, and the controller executes the retrieved content and performs the operation of the terminal according to the user input.

7. The terminal according to claim 4, wherein the proximity sensor module irradiates light to the content pad, and receives light reflected from the content pad, and the controller determines whether the content pad is attached on the basis of an amount of the received light.

8. The terminal according to claim 7, further including an optical guide for guiding light irradiated from the proximity sensor module.

9. The terminal according to claim 6, wherein the proximity sensor module includes:
a first proximity sensor module configured to detect the content pad; and
a second proximity sensor module configured to detect the user input.

10. The terminal according to claim 9, wherein
the first proximity sensor module is provided with a plurality of proximity sensors arranged in a row on a corner side of the terminal, and detects a length of an inner corner side of the content pad on the basis of a distance between the inner corner side and at least one of the plurality of proximity sensors which has detected the inner corner side of the content pad, and
the controller determines a type of the content pad on the basis of the detected length of the inner corner side.

11. The terminal according to claim 9, wherein the second proximity sensor module includes at least one of:
a plurality of first sensors provided to a left side of the terminal;
a plurality of second sensors provided to a right side of the terminal;
a plurality of third sensors provided to a lower side of the terminal; and
a plurality of fourth sensors provided to an upper side of the terminal.

* * * * *